United States Patent
Kaji et al.

(10) Patent No.: US 11,476,170 B2
(45) Date of Patent: Oct. 18, 2022

(54) POWER SEMICONDUCTOR MODULE AND POWER CONVERSION APPARATUS

(71) Applicant: Mitsubishi Electric Corporation, Tokyo (JP)

(72) Inventors: Yusuke Kaji, Tokyo (JP); Hisayuki Taki, Tokyo (JP); Seiki Hiramatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 102 days.

(21) Appl. No.: 17/046,303

(22) PCT Filed: Dec. 6, 2018

(86) PCT No.: PCT/JP2018/044829
§ 371 (c)(1),
(2) Date: Oct. 9, 2020

(87) PCT Pub. No.: WO2019/239615
PCT Pub. Date: Dec. 19, 2019

(65) Prior Publication Data
US 2021/0082778 A1    Mar. 18, 2021

(30) Foreign Application Priority Data

Jun. 12, 2018    (JP) .............................. JP2018-111698

(51) Int. Cl.
*H01L 23/06*    (2006.01)
*H01L 23/049*   (2006.01)
(Continued)

(52) U.S. Cl.
CPC ........ *H01L 23/049* (2013.01); *H01L 23/3107* (2013.01); *H01L 23/3735* (2013.01);
(Continued)

(58) Field of Classification Search
CPC ............ H01L 23/3107; H01L 23/3735; H01L 23/562; H01L 23/564; H01L 23/049;
(Continued)

(56) References Cited

U.S. PATENT DOCUMENTS 9,786,577 B2 * 10/2017  Terasaki ................. B23K 20/02
2017/0154855 A1  6/2017  Oi et al.
2017/0345729 A1  11/2017  Yasutomi et al.

FOREIGN PATENT DOCUMENTS

JP     2015-220238 A    12/2015
JP     2016-27645  A     2/2016
(Continued)

OTHER PUBLICATIONS

International Search Report and Written Opinion dated Feb. 19, 2019 for PCT/JP2018/044829 filed on Dec. 6, 2018, 12 pages including English Translation of the International Search Report.

*Primary Examiner* — Kimberly N Rizkallah
*Assistant Examiner* — Dilinh P Nguyen
(74) *Attorney, Agent, or Firm* — Xsensus LLP

(57) ABSTRACT

A power semiconductor module includes an insulating substrate, a first conductive circuit pattern, a second conductive circuit pattern, a first semiconductor device, a second semiconductor device, a sealing member, and a first barrier layer. The sealing member seals the first semiconductor device, the second semiconductor device, the first conductive circuit pattern, and the second conductive circuit pattern. At least one of the first barrier layer and the sealing member includes a first stress relaxation portion. This configuration improves the reliability of the power semiconductor module.

17 Claims, 10 Drawing Sheets

(51) Int. Cl.
  *H01L 23/31* (2006.01)
  *H01L 23/373* (2006.01)
  *H01L 23/00* (2006.01)
  *H01L 25/07* (2006.01)
  *H02P 27/06* (2006.01)

(52) U.S. Cl.
  CPC .......... *H01L 23/562* (2013.01); *H01L 23/564* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48155* (2013.01); *H01L 2224/48175* (2013.01); *H01L 2224/73265* (2013.01); *H01L 2924/1033* (2013.01); *H01L 2924/10253* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/15787* (2013.01); *H01L 2924/1811* (2013.01); *H01L 2924/351* (2013.01); *H02P 27/06* (2013.01)

(58) Field of Classification Search
  CPC ......... H01L 24/32; H01L 24/48; H01L 24/73; H01L 25/072; H01L 2224/32225; H01L 2224/48155; H01L 2224/48175; H01L 2224/73265; H01L 2924/15787; H01L 2924/1811; H01L 2924/351
  USPC ....................................................... 257/703
  See application file for complete search history.

(56) References Cited

FOREIGN PATENT DOCUMENTS

| | | | |
|---|---|---|---|
| WO | 2014/128899 | A1 | 8/2014 |
| WO | 2016/120997 | A1 | 8/2016 |
| WO | 2018/056287 | A1 | 3/2018 |

* cited by examiner

POWER SEMICONDUCTOR MODULE AND POWER CONVERSION APPARATUS

CROSS-REFERENCE TO RELATED APPLICATIONS

The present application is based on PCT filing PCT/JP2018/044829, filed Dec. 6, 2018, which claims priority to JP 2018-111698, filed Jun. 12, 2018, the entire contents of each are incorporated herein by reference.

TECHNICAL FIELD

The present invention relates to a power semiconductor module and a power conversion apparatus.

BACKGROUND ART

WO 2014/128899 (PTL 1) discloses semiconductor equipment including a plurality of semiconductor devices, a substrate having the plurality of semiconductor devices mounted thereon, and resin sealing the substrate and the plurality of semiconductor devices. The semiconductor devices and the substrate are partially covered with a glass film that contains vanadium and tellurium. The glass film prevents or reduces moisture from penetrating to the semiconductor devices and other components.

CITATION LIST

Patent Literature

PTL 1: WO 2014/128899

SUMMARY OF INVENTION

Technical Problem

However, while in operation or under an ambient temperature change, the semiconductor equipment disclosed in PTL 1 warps. This causes stress on the glass film, causing cracks in the glass film. The cracks in the glass film let moisture and gas through, decreasing the reliability of the semiconductor equipment. The present invention has been made in view of the above problem. An object of the present invention is to provide a power semiconductor module and a power conversion apparatus having improved reliability.

Solution to Problem

A power semiconductor module of the present invention includes an insulating substrate, a first conductive circuit pattern, a second conductive circuit pattern, a first semiconductor device, a second semiconductor device, a sealing member, and a first barrier layer. The insulating substrate includes a first main face. The first conductive circuit pattern is provided on the first main face. The second conductive circuit pattern is provided on the first main face. The second conductive circuit pattern is separated from the first conductive circuit pattern by a first gap. The first semiconductor device is joined to the first conductive circuit pattern. The second semiconductor device is joined to the second conductive circuit pattern. The sealing member seals the first semiconductor device, the second semiconductor device, the first conductive circuit pattern, and the second conductive circuit pattern. The first barrier layer is disposed on the opposite side from the insulating substrate with respect to the first semiconductor device and the second semiconductor device. The first barrier layer is provided on or in the sealing member. At least one of the first barrier layer and the sealing member includes a first stress relaxation portion.

A power conversion apparatus of the present invention includes a main conversion circuit and a control circuit. The main conversion circuit includes a power semiconductor module of the present invention and is configured to convert input power and output the converted power. The control circuit is configured to output a control signal to the main conversion circuit for controlling the main conversion circuit.

Advantageous Effects of Invention

In the power semiconductor module and the power conversion apparatus of the present invention, the first barrier layer prevents or reduces moisture and gas from penetrating to the first semiconductor device, the second semiconductor device, the first conductive circuit pattern, the second conductive circuit pattern, and the insulating substrate. The first stress relaxation portion reduces stress on the first barrier layer caused by the warp of the power semiconductor module, and prevents the first barrier layer from cracking. The power semiconductor module of the present invention has improved reliability.

DESCRIPTION OF EMBODIMENTS

Embodiments of the present invention will now be described. Like parts are designated by like reference signs, and the description of such parts is not repeated.

Embodiment 1

Figure 1:
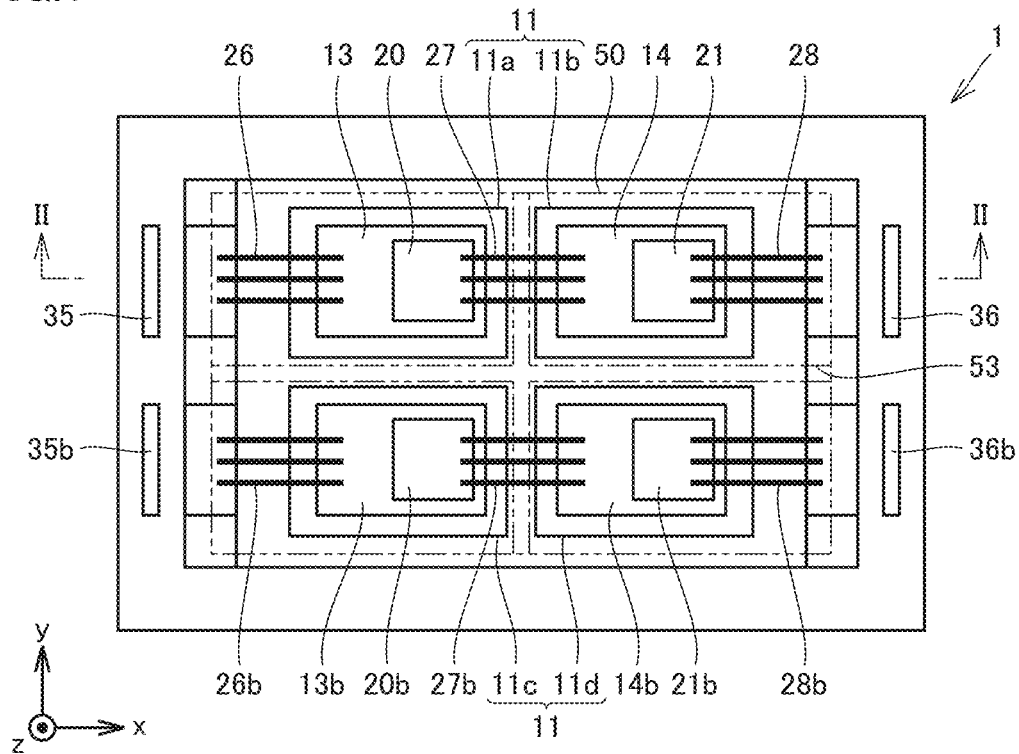
FIG. 1 is a schematic plan view of a power semiconductor module according to embodiment 1.
Figure 2:
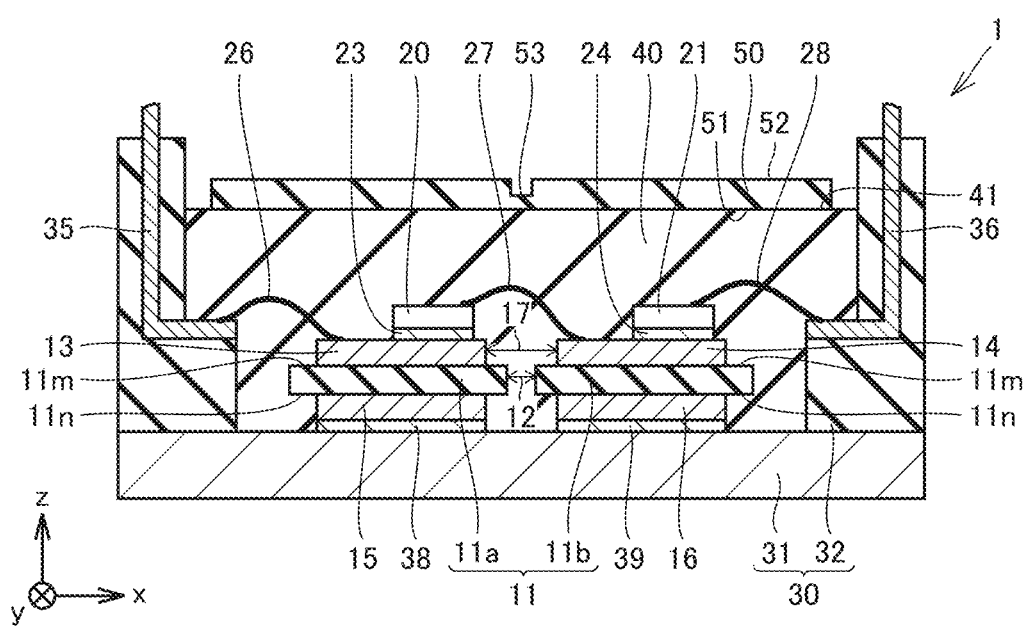
FIG. 2 is an enlarged schematic partial cross-sectional view of the power semiconductor module according to embodiment 1, taken along section line II-II in FIG. 1.

With reference to FIGS. 1 and 2, a power semiconductor module 1 in embodiment 1 will now be described. Power semiconductor module 1 mainly includes an insulating substrate 11, a first conductive circuit pattern 13, a second conductive circuit pattern 14, a first semiconductor device 20, a second semiconductor device 21, a sealing member 40, and a first barrier layer 50. Power semiconductor module 1 may further include a case 30. Power semiconductor module 1 may further include a third conductive circuit pattern 13$b$, a fourth conductive circuit pattern 14$b$, a third semiconductor device 20$b$, and a fourth semiconductor device 21$b$.

Insulating substrate 11 extends in a first direction (x-direction) and in a second direction (y-direction) perpendicular to the first direction. Insulating substrate 11 includes a first main face 11$m$ and a second main face 11$n$ opposite to first main face 11$m$. Insulating substrate 11 may include a first insulating substrate segment 11$a$ and a second insulating substrate segment 11$b$. Second insulating substrate segment 11$b$ is separated from first insulating substrate segment 11$a$ by a second gap 12 in the first direction (x-direction). Second gap 12 may be located in the central portion of power semiconductor module 1 in the first direction (x-direction). As used herein, the central portion of the power semiconductor module in the first direction (x-direction) refers to the middle portion of the three portions when the power semiconductor module is trisected along the first direction (x-direction).

Insulating substrate 11 may further include a third insulating substrate segment 11$c$ and a fourth insulating substrate segment 11$d$. Third insulating substrate segment 11$c$ is separated from first insulating substrate segment 11$a$ by a gap in the second direction (y-direction). The gap between first insulating substrate segment 11$a$ and third insulating substrate segment 11$c$ may be located in the central portion of power semiconductor module 1 in the second direction (y-direction). As used herein, the central portion of the power semiconductor module in the second direction (y-direction) refers to the middle portion of the three portions when the power semiconductor module is trisected along the second direction (y-direction).

Fourth insulating substrate segment 11$d$ is separated from second insulating substrate segment 11$b$ by a gap in the second direction (y-direction). The gap between second insulating substrate segment 11$b$ and fourth insulating substrate segment 11$d$ may be located in the central portion of power semiconductor module 1 in the second direction (y-direction). Fourth insulating substrate segment 11$d$ is separated from third insulating substrate segment 11$c$ by a gap in the first direction (x-direction). The gap between third insulating substrate segment 11$c$ and fourth insulating substrate segment 11$d$ may be located in the central portion of power semiconductor module 1 in the first direction (x-direction).

Insulating substrate 11 may be composed of, but is not limited to, an inorganic ceramic material, such as alumina ($Al_2O_3$), aluminum nitride (AlN), silicon nitride ($Si_3N_4$), silicon dioxide ($SiO_2$), or boron nitride (BN). Insulating substrate 11 may be composed of a resin material with at least one of fine grain and filler dispersed. The at least one of fine grain and filler may be composed of an inorganic ceramic material, such as alumina ($Al_2O_3$), aluminum nitride (AlN), silicon nitride ($Si_3N_4$), silicon dioxide ($SiO_2$), boron nitride (BN), diamond (C), silicon carbide (SiC), or boron oxide ($B_2O_3$); or may be composed of a resin material, such as silicone resin or acrylic resin. The resin with at least one of fine grain and filler dispersed has electrical insulation properties. The resin with at least one of fine grain and filler dispersed may be composed of, but is not limited to, epoxy resin, polyimide resin, silicone resin, or acrylic resin.

First conductive circuit pattern 13 is provided on first main face 11$m$. In particular, first conductive circuit pattern 13 may be provided on first insulating substrate segment 11$a$. Second conductive circuit pattern 14 is provided on first main face 11$m$. Second conductive circuit pattern 14 is separated from first conductive circuit pattern 13 by a first gap 17 in the first direction (x-direction). First gap 17 may be located in the central portion of power semiconductor module 1 in the first direction (x-direction). In particular, second conductive circuit pattern 14 may be provided on second insulating substrate segment 11$b$. Each of first conductive circuit pattern 13 and second conductive circuit pattern 14 may be composed of, but is not limited to, a metal material, such as copper or aluminum.

Third conductive circuit pattern 13$b$ is provided on first main face 11$m$. In particular, third conductive circuit pattern 13$b$ may be provided on third insulating substrate segment 11$c$. Third conductive circuit pattern 13$b$ is separated from first conductive circuit pattern 13 by a gap in the second direction (y-direction). The gap between first conductive circuit pattern 13 and third conductive circuit pattern 13$b$ may be located in the central portion of power semiconductor module 1 in the second direction (y-direction).

Fourth conductive circuit pattern 14$b$ is provided on first main face 11$m$. In particular, fourth conductive circuit pattern 14$b$ may be provided on fourth insulating substrate segment 11$d$. Fourth conductive circuit pattern 14$b$ is separated from second conductive circuit pattern 14 by a gap in the second direction (y-direction). The gap between second conductive circuit pattern 14 and fourth conductive circuit pattern 14$b$ may be located in the central portion of power semiconductor module 1 in the second direction (y-direction). Fourth conductive circuit pattern 14$b$ is separated from third conductive circuit pattern 13$b$ by a gap in the first direction (x-direction). The gap between third conductive circuit pattern 13$b$ and fourth conductive circuit pattern 14$b$ may be located in the central portion of power semiconductor module 1 in the first direction (x-direction). Each of third conductive circuit pattern 13$b$ and fourth conductive circuit pattern 14$b$ may be composed of, but is not limited to, a metal material, such as copper or aluminum.

A first conductive member 15 is provided on second main face 11$n$. In particular, first conductive member 15 may be provided on first insulating substrate segment 11$a$. A second conductive member 16 is provided on second main face 11$n$. Second conductive member 16 is separated from first conductive member 15 by a gap in the first direction (x-direction). In particular, second conductive member 16 is provided on second insulating substrate segment 11b. Each of first conductive member 15 and second conductive member 16 may be composed of, but is not limited to, a metal material, such as copper or aluminum.

A third conductive member (not shown) is provided on second main face 11n. In particular, the third conductive member may be provided on third insulating substrate segment 11c. The third conductive member is separated from first conductive member 15 by a gap in the second direction (y-direction). A fourth conductive member (not shown) is provided on second main face 11n. The fourth conductive member is separated from second conductive member 16 by a gap in the second direction (y-direction). The fourth conductive member is separated from the third conductive member by a gap in the first direction (x-direction). In particular, the fourth conductive member may be provided on fourth insulating substrate segment 11d. Each of the third conductive member and the fourth conductive member may be composed of, but is not limited to, a metal material, such as copper or aluminum.

Each of first semiconductor device 20, second semiconductor device 21, third semiconductor device 20b, and fourth semiconductor device 21b may be a power semiconductor device, such as an insulated gate bipolar transistor (IGBT) or metal-oxide-semiconductor field-effect transistor (MOSFET); or may be a diode, such as a freewheeling diode. Each of first semiconductor device 20, second semiconductor device 21, third semiconductor device 20b, and fourth semiconductor device 21b may be composed of silicon (Si); or a wide-bandgap semiconductor material such as silicon carbide (SiC), gallium nitride (GaN), or diamond. First semiconductor device 20, second semiconductor device 21, third semiconductor device 20b, and fourth semiconductor device 21b may be the same as or different from one another in terms of at least one of the type and the material.

First semiconductor device 20 and second semiconductor device 21 are aligned along the first direction (x-direction). Third semiconductor device 20b and fourth semiconductor device 21b are aligned along the first direction (x-direction). First semiconductor device 20 and third semiconductor device 20b are aligned along the second direction (y-direction). Second semiconductor device 21 and fourth semiconductor device 21b are aligned along the second direction (y-direction). The plurality of semiconductor devices, though aligned in two rows along the first direction (x-direction) in the present embodiment, may be aligned in three or more rows along the first direction (x-direction). The plurality of semiconductor devices, though aligned in two columns along the second direction (y-direction) in the present embodiment, may be aligned in three or more columns along the second direction (y-direction).

First semiconductor device 20 is joined to first conductive circuit pattern 13 using a conductive joining member 23, such as solder. Second semiconductor device 21 is joined to second conductive circuit pattern 14 using a conductive joining member 24, such as solder. Third semiconductor device 20b is joined to third conductive circuit pattern 13b using a conductive joining member (not shown), such as solder. Fourth semiconductor device 21b is joined to fourth conductive circuit pattern 14b using a conductive joining member (not shown), such as solder.

First semiconductor device 20 is electrically connected to a lead terminal 35 via conductive wires 26 and first conductive circuit pattern 13. Second semiconductor device 21 is electrically connected to first semiconductor device 20 via conductive wires 27 and second conductive circuit pattern 14. Second semiconductor device 21 is electrically connected to a lead terminal 36 via conductive wires 28.

Third semiconductor device 20b is electrically connected to a lead terminal 35b via conductive wires 26b and third conductive circuit pattern 13b. Fourth semiconductor device 21b is electrically connected to third semiconductor device 20b via conductive wires 27b and fourth conductive circuit pattern 14b. Fourth semiconductor device 21b is electrically connected to a lead terminal 36b via conductive wires 28b.

Sealing member 40 seals first semiconductor device 20, second semiconductor device 21, first conductive circuit pattern 13, second conductive circuit pattern 14, and conductive wires 26, 27, 28. Sealing member 40 has electrical insulation properties. Sealing member 40 may further seal insulating substrate 11. Sealing member 40 may further seal first conductive member 15 and second conductive member 16. Sealing member 40 may further seal third conductive circuit pattern 13b, fourth conductive circuit pattern 14b, and conductive wires 26b, 27b, 28b. Sealing member 40 may further seal the third conductive member (not shown) and the fourth conductive member (not shown).

Sealing member 40 may be composed of an insulating resin, such as epoxy resin, silicone resin, urethane resin, polyimide resin, polyamide resin, or acrylic resin. Sealing member 40 may be composed of an insulating resin material with dispersed fine grain or filler that improves the strength and heat conductivity of sealing member 40. The fine grain or filler that improves the strength and heat conductivity of sealing member 40 may be composed of an inorganic ceramic material, such as silicon dioxide ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$).

Case 30 may include a base plate 31, an enclosure 32, and lead terminals 35, 35b, 36, 36b. Base plate 31 is disposed on the opposite side from first and second semiconductor devices 20 and 21 with respect to insulating substrate 11. Base plate 31 may be composed of, but is not limited to, a metal material, such as copper (Cu) or aluminum (Al). Base plate 31 may be composed of, but is not limited to, an alloy of aluminum and silicon carbide (AlSiC), or an alloy of copper and molybdenum (CuMo). Base plate 31 may be composed of, but is not limited to, an organic material, such as epoxy resin, polyimide resin, acrylic resin, or polyphenylenesulfide (PPS) resin.

Insulating substrate 11 is joined to base plate 31. Specifically, first insulating substrate segment 11a may be bonded to base plate 31 via first conductive member 15 and a joining layer 38. Second insulating substrate segment 11b may be bonded to base plate 31 via second conductive member 16 and a joining layer 39. Third insulating substrate segment 11c may be bonded to base plate 31 via the third conductive member (not shown) and a joining layer (not shown). Fourth insulating substrate segment 11d may be bonded to base plate 31 via the fourth conductive member (not shown) and a joining layer (not shown). Each of joining layers 38, 39 may be composed of a resin adhesive, such as a silicone resin adhesive, or a conductive joining material, such as solder.

Enclosure 32 is bonded to base plate 31. Enclosure 32 includes lead terminals 35, 35b, 36, 36b. Enclosure 32 may be composed of an electrically insulating resin, such as epoxy resin, polyimide resin, acrylic resin, or polyphenylenesulfide (PPS) resin. Lead terminals 35, 35b, 36, 36b are led out of power semiconductor module 1 through enclosure 32. Lead terminals 35, 35b, 36, 36b do not pass through first barrier layer 50 or are not in contact with first barrier layer 50. In the present embodiment, no interface is formed between lead terminals 35, 35b, 36, 36b and first barrier layer 50. Accordingly, power semiconductor module 1 can avoid the penetration of moisture and gas through an interface. Each of lead terminals 35, 35b, 36, 36b may be composed of a metal material, such as copper or aluminum.

First barrier layer 50 is disposed on the opposite side from insulating substrate 11 with respect to first and second semiconductor devices 20 and 21. First barrier layer 50 is disposed on the opposite side from insulating substrate 11 with respect to third and fourth semiconductor devices 20b and 21b. First barrier layer 50 is provided on or in sealing member 40. In the present embodiment, first barrier layer 50 is provided on sealing member 40. In plan view of first main face 11m of insulating substrate 11, first barrier layer 50 covers first semiconductor device 20, second semiconductor device 21, third semiconductor device 20b, and fourth semiconductor device 21b. In plan view of first main face 11m of insulating substrate 11, first barrier layer 50 may cover 80% or more of the area of an outer surface 41 of sealing member 40; or may cover 90% or more of the area of outer surface 41 of sealing member 40; or may cover the whole outer surface 41 of sealing member 40.

First barrier layer 50 prevents moisture and gas (e.g., sulfur gas) from entering power semiconductor module 1. First barrier layer 50 prevents or reduces moisture and gas from penetrating to first semiconductor device 20, second semiconductor device 21, first conductive circuit pattern 13, second conductive circuit pattern 14, insulating substrate 11, first conductive member 15, second conductive member 16, and conductive wires 26, 27, 28. First barrier layer 50 can prevent the increase in leakage current from, for example, first and second semiconductor devices 20 and 21; and can prevent the decrease in insulation performance of, for example, insulating substrate 11 (first insulating substrate segment 11a, second insulating substrate segment 11b).

First barrier layer 50 prevents or reduces moisture and gas from penetrating to third semiconductor device 20b, fourth semiconductor device 21b, third conductive circuit pattern 13b, fourth conductive circuit pattern 14b, the third conductive member (not shown), the fourth conductive member (not shown), and conductive wires 26b, 27b, 28b. First barrier layer 50 can prevent the increase in leakage current from, for example, third and fourth semiconductor devices 20b and 21b; and can prevent the decrease in insulation performance of, for example, insulating substrate 11 (third insulating substrate segment 11c, fourth insulating substrate segment 11d).

First barrier layer 50 is composed of a material having low permeability to moisture and gas. First barrier layer 50 may be composed of a thermoplastic resin, such as polyphenylenesulfide (PPS), polybutylene terephthalate (PBT), or polyether ether ketone (PEEK); a thermosetting resin; a fluoropolymer, such as polytetrafluoroethylene (PTFE); a ceramic or glass material; or a mixture of any of these materials.

Figure 3:
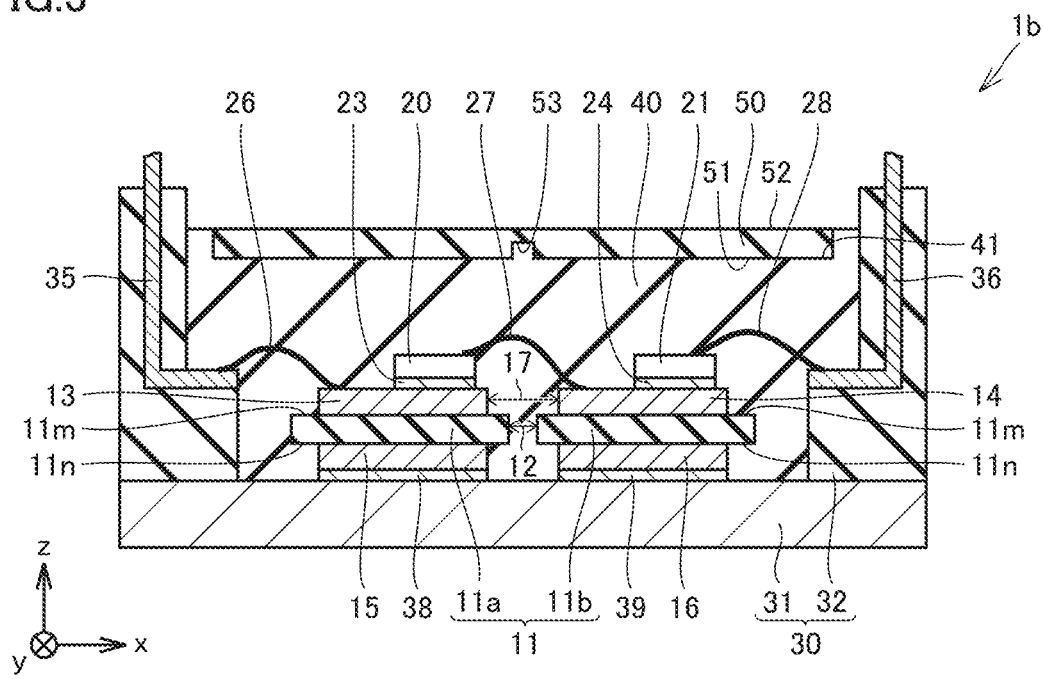
FIG. 3 is a schematic cross-sectional view of a power semiconductor module according to a first variation of embodiment 1.

At least one of first barrier layer 50 and sealing member 40 includes a first stress relaxation portion 53. In the present embodiment, first barrier layer 50 includes first stress relaxation portion 53. First barrier layer 50 includes a first surface 51 on the side where first and second semiconductor devices 20 and 21 are located, and a second surface 52 on the side opposite to first surface 51. First stress relaxation portion 53 is a first recess formed in at least one of first surface 51 and second surface 52. In the present embodiment shown in FIG. 2, first stress relaxation portion 53 is a first recess formed in second surface 52 of first barrier layer 50. First stress relaxation portion 53 may be a first recess formed in first surface 51 of first barrier layer 50, as seen in a power semiconductor module 1b in a first variation of the present embodiment shown in FIG. 3.

Figure 4:
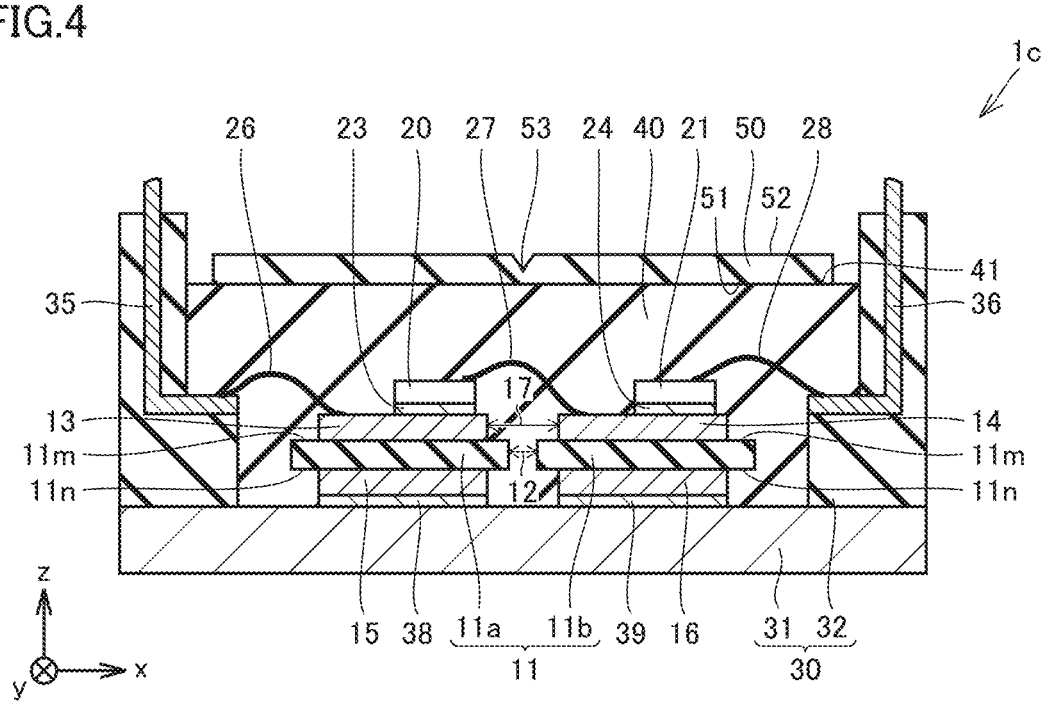
FIG. 4 is a schematic cross-sectional view of a power semiconductor module according to a second variation of embodiment 1.

The first recess (first stress relaxation portion 53) may be tapered, as seen in a power semiconductor module 1c in a second variation of the present embodiment shown in FIG. 4. The first recess may extend along at least one of the first direction (x-direction) and second direction (y-direction). The first recess may include a plurality of first sub-recesses aligned along at least one of the first direction (x-direction) and second direction (y-direction).

Power semiconductor module 1, 1b, 1c is composed of a plurality of members having different coefficients of linear thermal expansion, such as first barrier layer 50, sealing member 40, and insulating substrate 11. While in operation or under an ambient temperature change, power semiconductor module 1, 1b, 1c undergoes a temperature change and warps. First stress relaxation portion 53 reduces stress on first barrier layer 50 caused by the warp of power semiconductor module 1, 1b, 1c. Specifically, first stress relaxation portion 53 in the form of a first recess reduces the thickness of at least one of first barrier layer 50 and sealing member 40. The first recess allows at least one of first barrier layer 50 and sealing member 40 to easily deform in accordance with the warping deformation of power semiconductor module 1, 1b, 1c. The first recess thus reduces stress on first barrier layer 50 caused by the warp of power semiconductor module 1, 1b, 1c, and prevents first barrier layer 50 from cracking.

In plan view of first main face 11m of insulating substrate 11, first stress relaxation portion 53 overlaps first gap 17 between first conductive circuit pattern 13 and second conductive circuit pattern 14. In plan view of first main face 11m of insulating substrate 11, first stress relaxation portion 53 may have a smaller width than first gap 17, and may be within first gap 17. In plan view of first main face 11m of insulating substrate 11, first stress relaxation portion 53 may have the same width as first gap 17, or may have a larger width than first gap 17. First stress relaxation portion 53 may be located in the central portion of power semiconductor module 1, 1b, 1c in the first direction (x-direction).

In plan view of first main face 11m of insulating substrate 11, first stress relaxation portion 53 overlaps the gap between third conductive circuit pattern 13b and fourth conductive circuit pattern 14b. In plan view of first main face 11m of insulating substrate 11, first stress relaxation portion 53 may have a smaller width than the gap between third conductive circuit pattern 13b and fourth conductive circuit pattern 14b, and may be within the gap between third conductive circuit pattern 13b and fourth conductive circuit pattern 14b. In plan view of first main face 11m of insulating substrate 11, first stress relaxation portion 53 may have the same width as the gap between third conductive circuit pattern 13b and fourth conductive circuit pattern 14b, or may have a larger width than the gap between third conductive circuit pattern 13b and fourth conductive circuit pattern 14b.

In plan view of first main face 11m of insulating substrate 11, first stress relaxation portion 53 overlaps the gap between first conductive circuit pattern 13 and third conductive circuit pattern 13b. In plan view of first main face 11m of insulating substrate 11, first stress relaxation portion 53 may have a smaller width than the gap between first conductive circuit pattern 13 and third conductive circuit pattern 13b, and may be within the gap between first conductive circuit pattern 13 and third conductive circuit pattern 13b. In plan view of first main face 11m of insulating substrate 11, first stress relaxation portion 53 may have the same width as the gap between first conductive circuit pattern 13 and third conductive circuit pattern 13b, or may have a larger width than the gap between first conductive circuit pattern 13 and third conductive circuit pattern 13b. First stress relaxation portion 53 may be located in the central portion of power semiconductor module 1, 1b, 1c in the second direction (y-direction).

In plan view of first main face 11m of insulating substrate 11, first stress relaxation portion 53 overlaps the gap between second conductive circuit pattern 14 and fourth conductive circuit pattern 14b. In plan view of first main face 11m of insulating substrate 11, first stress relaxation portion 53 may have a smaller width than the gap between second conductive circuit pattern 14 and fourth conductive circuit pattern 14b, and may be within the gap between second conductive circuit pattern 14 and fourth conductive circuit pattern 14b. In plan view of first main face 11m of insulating substrate 11, first stress relaxation portion 53 may have the same width as the gap between second conductive circuit pattern 14 and fourth conductive circuit pattern 14b, or may have a larger width than the gap between second conductive circuit pattern 14 and fourth conductive circuit pattern 14b.

In plan view of first main face 11m of insulating substrate 11, first stress relaxation portion 53 may overlap second gap 12 between first insulating substrate segment 11a and second insulating substrate segment 11b. In plan view of first main face 11m of insulating substrate 11, first stress relaxation portion 53 may have a smaller width than second gap 12, and may be within second gap 12. In plan view of first main face 11m of insulating substrate 11, first stress relaxation portion 53 may have the same width as second gap 12, or may have a larger width than second gap 12.

In plan view of first main face 11m of insulating substrate 11, first stress relaxation portion 53 may overlap the gap between third insulating substrate segment 11c and fourth insulating substrate segment 11d. In plan view of first main face 11m of insulating substrate 11, first stress relaxation portion 53 may have a smaller width than the gap between third insulating substrate segment 11c and fourth insulating substrate segment 11d, and may be within the gap between third insulating substrate segment 11c and fourth insulating substrate segment 11d. In plan view of first main face 11m of insulating substrate 11, first stress relaxation portion 53 may have the same width as the gap between third insulating substrate segment 11c and fourth insulating substrate segment 11d, or may have a larger width than the gap between third insulating substrate segment 11c and fourth insulating substrate segment 11d.

In plan view of first main face 11m of insulating substrate 11, first stress relaxation portion 53 may overlap the gap between first insulating substrate segment 11a and third insulating substrate segment 11c. In plan view of first main face 11m of insulating substrate 11, first stress relaxation portion 53 may have a smaller width than the gap between first insulating substrate segment 11a and third insulating substrate segment 11c, and may be within the gap between first insulating substrate segment 11a and third insulating substrate segment 11c. In plan view of first main face 11m of insulating substrate 11, first stress relaxation portion 53 may have the same width as the gap between first insulating substrate segment 11a and third insulating substrate segment 11c, or may have a larger width than the gap between first insulating substrate segment 11a and third insulating substrate segment 11c.

In plan view of first main face 11m of insulating substrate 11, first stress relaxation portion 53 may overlap the gap between second insulating substrate segment 11b and fourth insulating substrate segment 11d. In plan view of first main face 11m of insulating substrate 11, first stress relaxation portion 53 may have a smaller width than the gap between second insulating substrate segment 11b and fourth insulating substrate segment 11d, and may be within the gap between second insulating substrate segment 11b and fourth insulating substrate segment 11d. In plan view of first main face 11m of insulating substrate 11, first stress relaxation portion 53 may have the same width as the gap between second insulating substrate segment 11b and fourth insulating substrate segment 11d, or may have a larger width than the gap between second insulating substrate segment 11b and fourth insulating substrate segment 11d.

When power semiconductor module 1, 1b, 1c undergoes a temperature change and warps, stress concentrates on a portion of first barrier layer 50 corresponding to the central portion of power semiconductor module 1, 1b, 1c in the first direction (x-direction) and corresponding to the central portion of power semiconductor module 1, 1b, 1c in the second direction (y-direction). When power semiconductor module 1, 1b, 1c undergoes a temperature change and warps, stress concentrates on a portion of first barrier layer 50 corresponding to second gap 12 between first insulating substrate segment 11a and second insulating substrate segment 11b, corresponding to the gap between third insulating substrate segment 11c and fourth insulating substrate segment 11d, corresponding to the gap between first insulating substrate segment 11a and third insulating substrate segment 11c, and corresponding to the gap between second insulating substrate segment 11b and fourth insulating substrate segment 11d. In the present embodiment, first stress relaxation portion 53 is provided in a portion of first barrier layer 50 susceptible to stress concentration. First stress relaxation portion 53 effectively prevents first barrier layer 50 from cracking.

Figure 5:
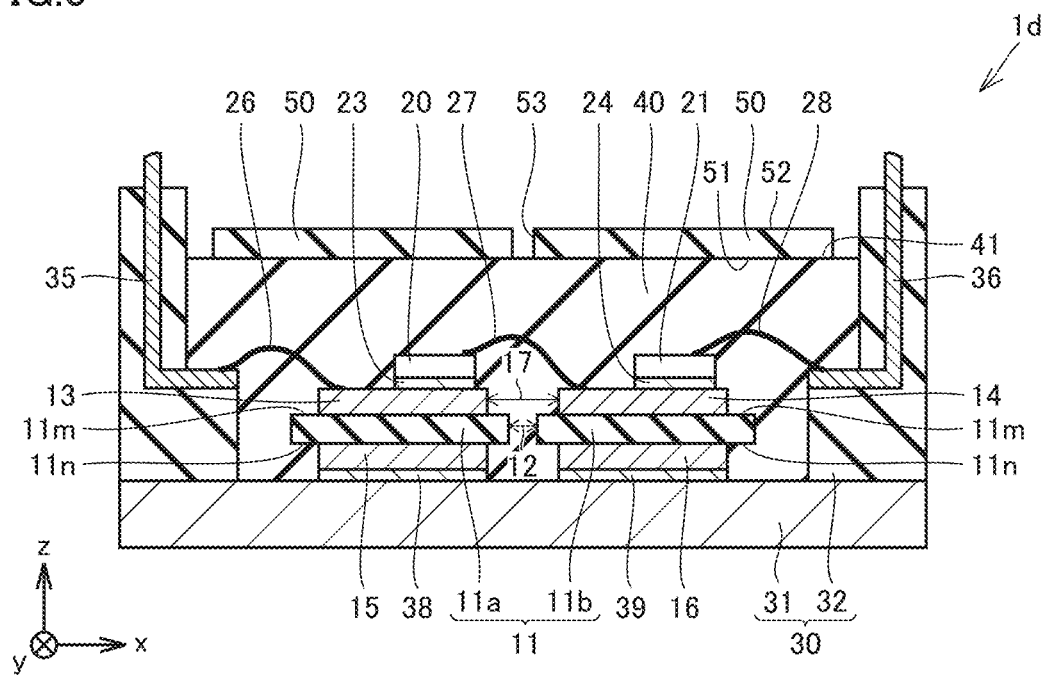
FIG. 5 is a schematic cross-sectional view of a power semiconductor module according to a third variation of embodiment 1.

First stress relaxation portion 53 may be a first through portion connecting first surface 51 to second surface 52, as seen in a power semiconductor module 1d in a third variation of the present embodiment shown in FIG. 5. The first through portion may be a first slot extending along at least one of the first direction (x-direction) and second direction (y-direction). The first through portion may include a plurality of first through holes aligned along at least one of the first direction (x-direction) and second direction (y-direction). The first through portion may separate first barrier layer 50 into a plurality of first barrier layer segments. A larger power semiconductor module 1d will produce an increased stress on first barrier layer 50 when warping. First stress relaxation portion 53 (first through portion) reduces the increased stress, and prevents first barrier layer 50 from cracking. First stress relaxation portion 53 thus prevents first barrier layer 50 from cracking.

The advantageous effects of power semiconductor module 1, 1b, 1c, 1d in the present embodiment will now be described.

Power semiconductor module 1, 1b, 1c, 1d in the present embodiment includes insulating substrate 11, first conductive circuit pattern 13, second conductive circuit pattern 14, first semiconductor device 20, second semiconductor device 21, sealing member 40, and first barrier layer 50. Insulating substrate 11 includes first main face 11m. First conductive circuit pattern 13 is provided on first main face 11m. Second conductive circuit pattern 14 is provided on first main face 11m. Second conductive circuit pattern 14 is separated from first conductive circuit pattern 13 by first gap 17. First semiconductor device 20 is joined to first conductive circuit pattern 13. Second semiconductor device 21 is joined to second conductive circuit pattern 14. Sealing member 40 seals first semiconductor device 20, second semiconductor device 21, first conductive circuit pattern 13, and second conductive circuit pattern 14. First barrier layer 50 is disposed on the opposite side from insulating substrate 11 with respect to first and second semiconductor devices 20 and 21. First barrier layer 50 is provided on sealing member 40. At least one of first barrier layer 50 and sealing member 40 includes first stress relaxation portion 53.

First barrier layer 50 prevents or reduces moisture and gas from penetrating to first semiconductor device 20, second semiconductor device 21, first conductive circuit pattern 13, second conductive circuit pattern 14, and insulating substrate 11. Further, first stress relaxation portion 53 reduces stress on first barrier layer 50 caused by the warp of power semiconductor module 1, 1b, 1c, 1d, and prevents first barrier layer 50 from cracking. The reliability of power semiconductor module 1, 1b, 1c, 1d can thus be improved.

Embodiment 2

Figure 6:
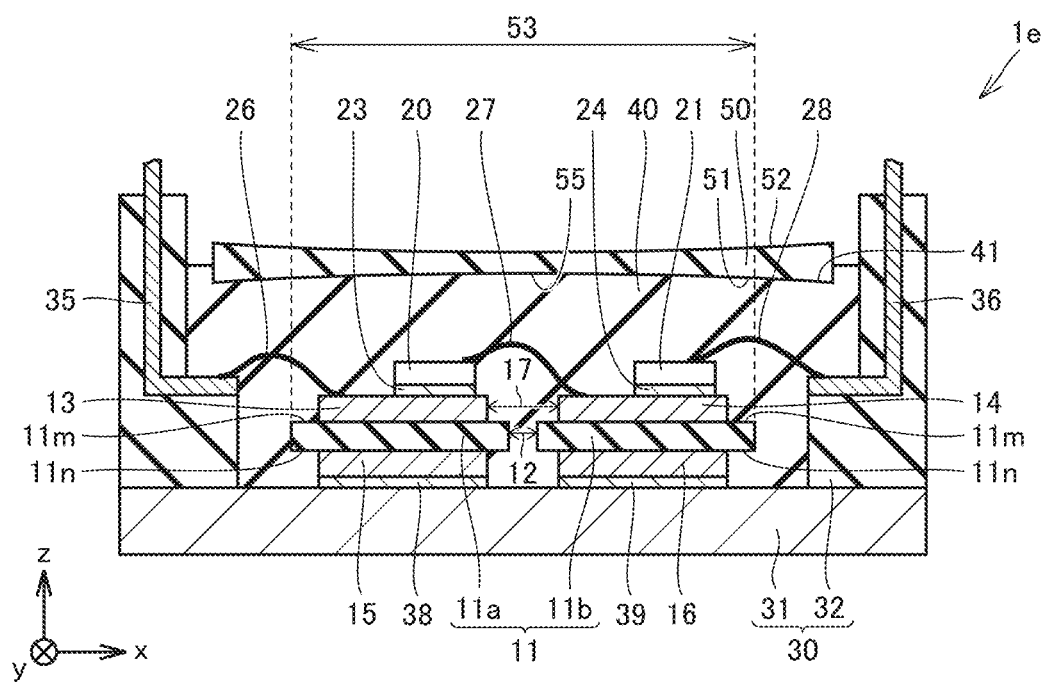
FIG. 6 is a schematic cross-sectional view of a power semiconductor module according to embodiment 2.

With reference to FIG. 6, a power semiconductor module 1e in embodiment 2 will now be described. Power semiconductor module 1e in the present embodiment has a configuration similar to that of power semiconductor module 1, 1b, 1c, 1d in embodiment 1, but differs from power semiconductor module 1, 1b, 1c, 1d mainly in the following respects.

In power semiconductor module 1e, first stress relaxation portion 53 is provided in first barrier layer 50 in such a way that first stress relaxation portion 53 is at a location corresponding to first conductive circuit pattern 13, second conductive circuit pattern 14, and first gap 17. The thickness of first barrier layer 50 gradually decreases toward a first portion 55 of first barrier layer 50 at least in first stress relaxation portion 53. In plan view of first main face 11m of insulating substrate 11, first portion 55 overlaps first gap 17 between first conductive circuit pattern 13 and second conductive circuit pattern 14. In plan view of first main face 11m of insulating substrate 11, first portion 55 is located within first gap 17. In plan view of first main face 11m of insulating substrate 11, first portion 55 is located within second gap 12. First portion 55 is located in the central portion of power semiconductor module 1e in the first direction (x-direction). The thickness of first barrier layer 50 is smallest at first portion 55 of first stress relaxation portion 53.

First barrier layer 50 is similarly configured in the portion corresponding to third conductive circuit pattern 13b, fourth conductive circuit pattern 14b, and the gap between third conductive circuit pattern 13b and fourth conductive circuit pattern 14b. First barrier layer 50 may be similarly configured in the portion corresponding to first conductive circuit pattern 13, third conductive circuit pattern 13b, and the gap between first conductive circuit pattern 13 and third conductive circuit pattern 13b. First barrier layer 50 may be similarly configured in the portion corresponding to second conductive circuit pattern 14, fourth conductive circuit pattern 14b, and the gap between second conductive circuit pattern 14 and fourth conductive circuit pattern 14b.

Power semiconductor module 1e in the present embodiment has the following advantageous effects, similar to power semiconductor module 1, 1b, 1c, 1d in embodiment 1. The thickness of first barrier layer 50 is smallest at first portion 55 of first stress relaxation portion 53. First stress relaxation portion 53 allows at least one of first barrier layer 50 and sealing member 40 to easily deform in accordance with the warping deformation of power semiconductor module 1e. First stress relaxation portion 53 reduces stress on first barrier layer 50 caused by the warp of power semiconductor module 1e, and prevents first barrier layer 50 from cracking. The reliability of power semiconductor module 1e can thus be improved.

Embodiment 3

Figure 7:
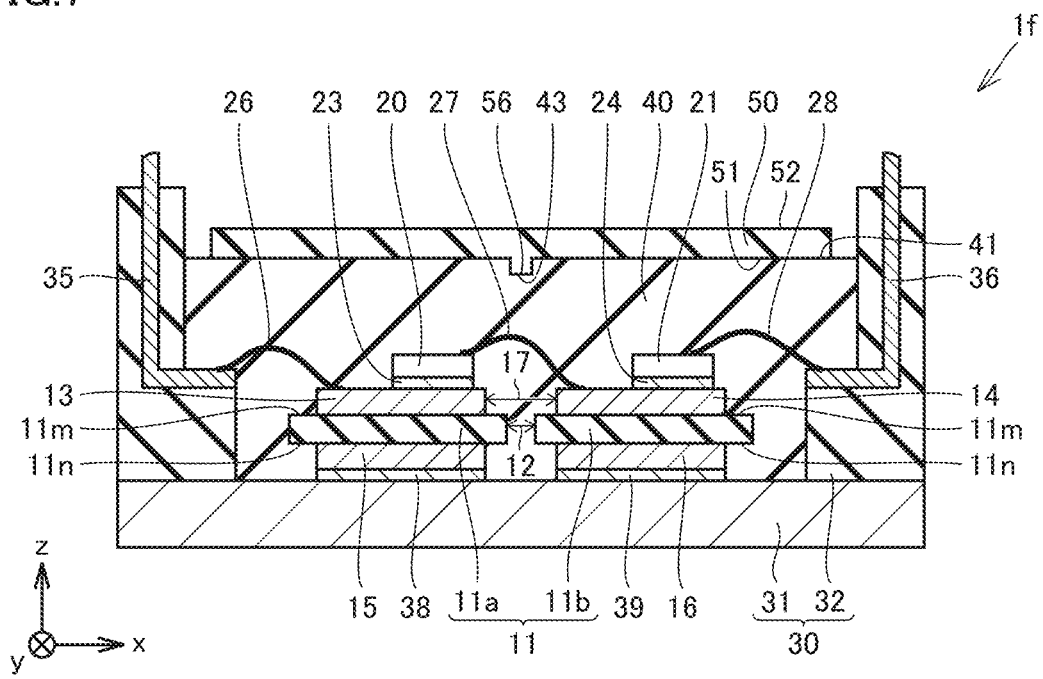
FIG. 7 is a schematic cross-sectional view of a power semiconductor module according to embodiment 3.

With reference to FIG. 7, a power semiconductor module 1f in embodiment 3 will now be described. Power semiconductor module 1f in the present embodiment has a configuration similar to that of power semiconductor module 1, 1b, 1c, 1d in embodiment 1, but differs from power semiconductor module 1, 1b, 1c, 1d mainly in the following respects.

Figure 8:
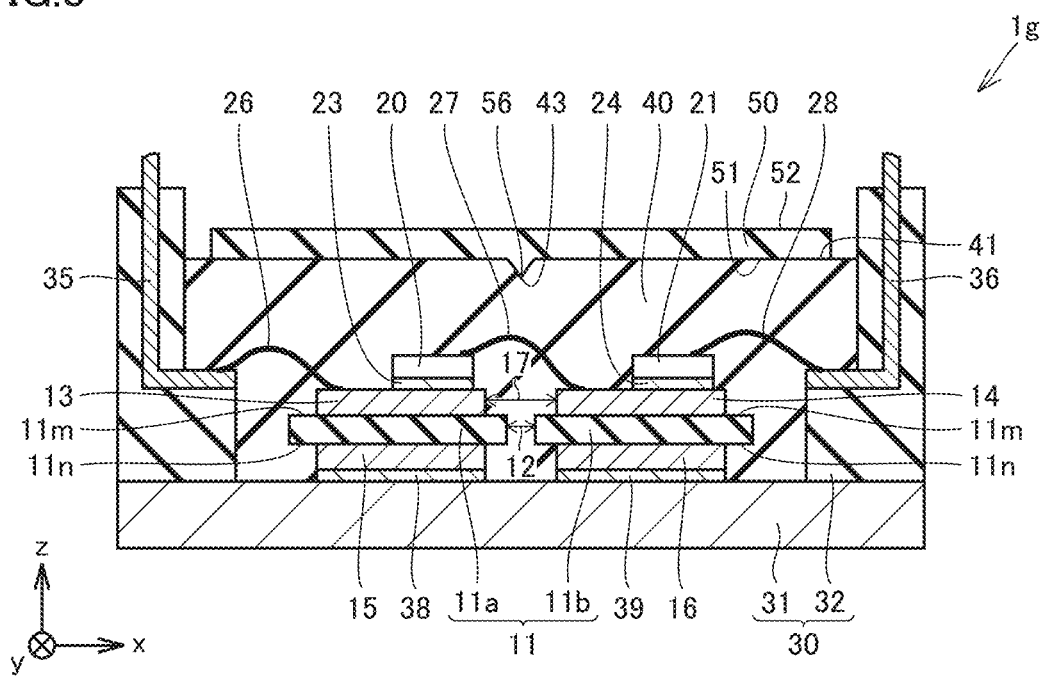
FIG. 8 is a schematic cross-sectional view of a power semiconductor module according to a variation of embodiment 3.

In power semiconductor module 1f, sealing member 40 includes a first stress relaxation portion 43. First stress relaxation portion 43 is a second recess formed in outer surface 41 of sealing member 40. The second recess may extend along at least one of the first direction (x-direction) and second direction (y-direction). The second recess may include a plurality of second sub-recesses aligned along at least one of the first direction (x-direction) and second direction (y-direction). The second recess (first stress relaxation portion 43) may be tapered, as seen in a power semiconductor module 1g in a variation of the present embodiment shown in FIG. 8.

In plan view of first main face 11m of insulating substrate 11, first stress relaxation portion 43 overlaps first gap 17 between first conductive circuit pattern 13 and second conductive circuit pattern 14. In plan view of first main face 11m of insulating substrate 11, first stress relaxation portion 43 may have a smaller width than first gap 17, and may be within first gap 17. In plan view of first main face 11m of insulating substrate 11, first stress relaxation portion 43 may have the same width as first gap 17, or may have a larger width than first gap 17. In plan view of first main face 11m of insulating substrate 11, first stress relaxation portion 43 overlaps second gap 12 between first insulating substrate segment 11a and second insulating substrate segment 11b. First stress relaxation portion 43 is located in the central portion of power semiconductor module 1f, 1g in the first direction (x-direction).

First barrier layer 50 includes a protrusion 56 protruding from first surface 51. Protrusion 56 may be complementary to the second recess (first stress relaxation portion 43) in shape. In plan view of first main face 11m of insulating substrate 11, protrusion 56 overlaps first gap 17 between first conductive circuit pattern 13 and second conductive circuit pattern 14. In particular, in plan view of first main face 11m of insulating substrate 11, protrusion 56 is located within first gap 17. In plan view of first main face 11m of insulating substrate 11, protrusion 56 overlaps second gap 12 between first insulating substrate segment 11a and second insulating substrate segment 11b. Protrusion 56 is located in the central portion of power semiconductor module 1f, 1g in the first direction (x-direction).

Sealing member 40 is similarly configured in the portion corresponding to third conductive circuit pattern 13b, fourth conductive circuit pattern 14b, and the gap between third conductive circuit pattern 13b and fourth conductive circuit pattern 14b. Sealing member 40 may be similarly configured in the portion corresponding to first conductive circuit pattern 13, third conductive circuit pattern 13b, and the gap between first conductive circuit pattern 13 and third conductive circuit pattern 13b. Sealing member 40 may be similarly configured in the portion corresponding to second conductive circuit pattern 14, fourth conductive circuit pattern 14b, and the gap between second conductive circuit pattern 14 and fourth conductive circuit pattern 14b.

In plan view of first main face 11m of insulating substrate 11, protrusion 56 of first barrier layer 50 overlaps the gap between third conductive circuit pattern 13b and fourth conductive circuit pattern 14b. In particular, in plan view of first main face 11m of insulating substrate 11, protrusion 56 is located within the gap between third conductive circuit pattern 13b and fourth conductive circuit pattern 14b. In plan view of first main face 11m of insulating substrate 11, protrusion 56 overlaps the gap between third insulating substrate segment 11c and fourth insulating substrate segment 11d. Protrusion 56 is located in the central portion of power semiconductor module 1f, 1g in the second direction (y-direction).

Power semiconductor module 1f, 1g in the present embodiment has the following advantageous effects, similar to power semiconductor module 1, 1b, 1c, 1d in embodiment 1. First stress relaxation portion 43 allows at least one of first barrier layer 50 and sealing member 40 to easily deform in accordance with the warping deformation of power semiconductor module 1f, 1g. First stress relaxation portion 43 reduces stress on first barrier layer 50 caused by the warp of power semiconductor module 1f, 1g, and prevents first barrier layer 50 from cracking. The reliability of power semiconductor module 1f, 1g can thus be improved.

Embodiment 4

Figure 9:
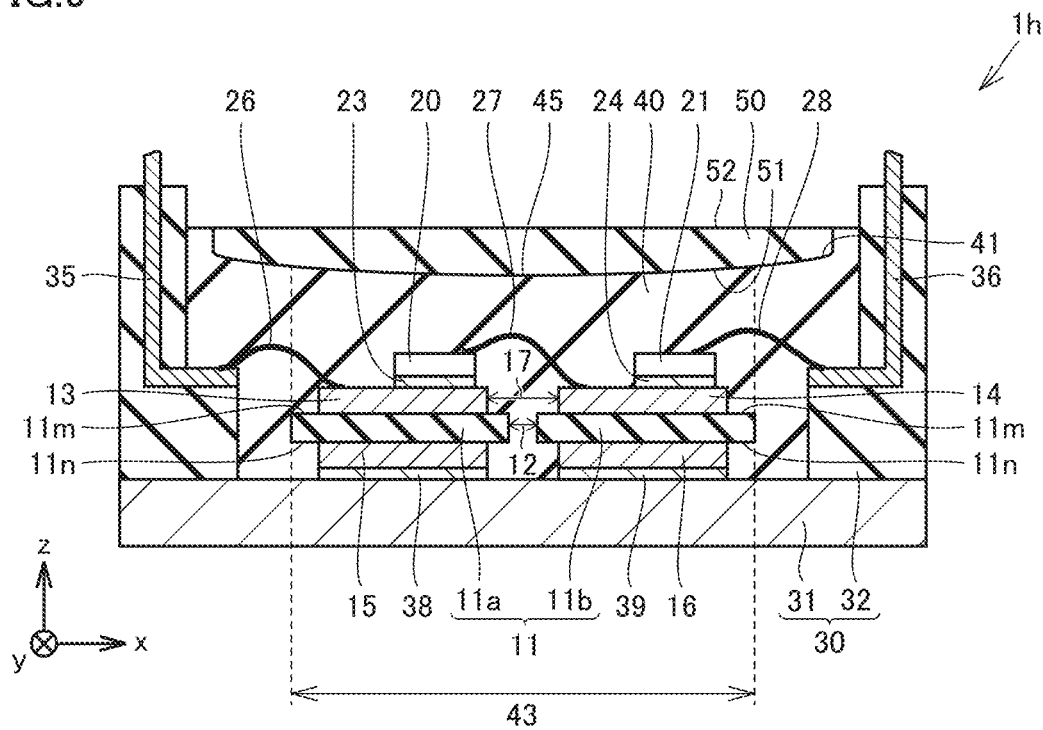
FIG. 9 is a schematic cross-sectional view of a power semiconductor module according to embodiment 4.

With reference to FIG. 9, a power semiconductor module 1h in embodiment 4 will now be described. Power semiconductor module 1h in the present embodiment has a configuration similar to that of power semiconductor module 1f, 1g in embodiment 3, but differs from power semiconductor module 1f, 1g mainly in the following respects.

In power semiconductor module 1h, first stress relaxation portion 43 is provided in sealing member 40 in such a way that first stress relaxation portion 43 is at a location corresponding to first conductive circuit pattern 13, second conductive circuit pattern 14, and first gap 17. Outer surface 41 of sealing member 40 is gradually recessed toward a second portion 45 of outer surface 41 at least in first stress relaxation portion 43. In plan view of first main face 11m of insulating substrate 11, second portion 45 overlaps first gap 17 between first conductive circuit pattern 13 and second conductive circuit pattern 14. In particular, in plan view of first main face 11m of insulating substrate 11, second portion 45 is located within first gap 17. First stress relaxation portion 43 overlaps second gap 12 between first insulating substrate segment 11a and second insulating substrate segment 11b. Second portion 45 is located in the central portion of power semiconductor module 1h in the first direction (x-direction). Outer surface 41 of sealing member 40 is recessed deepest at second portion 45 of first stress relaxation portion 43.

Outer surface 41 of sealing member 40 is similarly configured in the portion corresponding to third conductive circuit pattern 13b, fourth conductive circuit pattern 14b, and the gap between third conductive circuit pattern 13b and fourth conductive circuit pattern 14b. Outer surface 41 of sealing member 40 may be similarly configured in the portion corresponding to first conductive circuit pattern 13, third conductive circuit pattern 13b, and the gap between first conductive circuit pattern 13 and third conductive circuit pattern 13b. Outer surface 41 of sealing member 40 may be similarly configured in the portion corresponding to second conductive circuit pattern 14, fourth conductive circuit pattern 14b, and the gap between second conductive circuit pattern 14 and fourth conductive circuit pattern 14b.

Power semiconductor module 1h in the present embodiment has the following advantageous effects, similar to power semiconductor module 1f, 1g in embodiment 3. Outer surface 41 of sealing member 40 is recessed deepest at second portion 45 of first stress relaxation portion 43. First stress relaxation portion 43 allows at least one of first barrier layer 50 and sealing member 40 to easily deform in accordance with the warping deformation of power semiconductor module 1h. First stress relaxation portion 43 reduces stress on first barrier layer 50 caused by the warp of power semiconductor module 1h, and prevents first barrier layer 50 from cracking. The reliability of power semiconductor module 1h can thus be improved.

Embodiment 5

Figure 10:
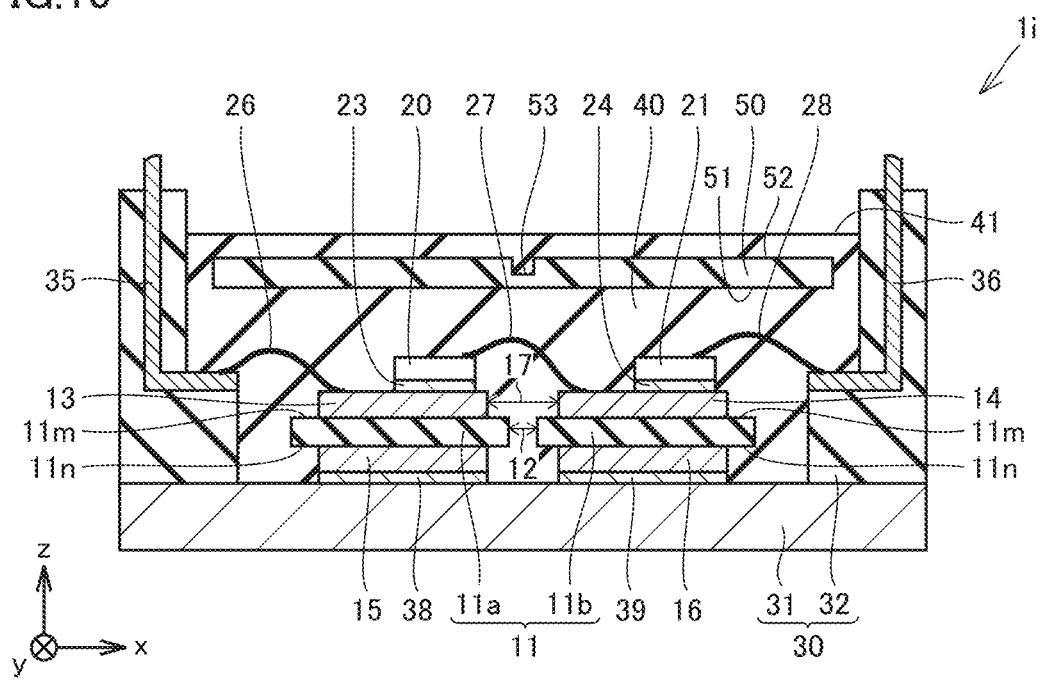
FIG. 10 is a schematic cross-sectional view of a power semiconductor module according to embodiment 5.
Figure 11:
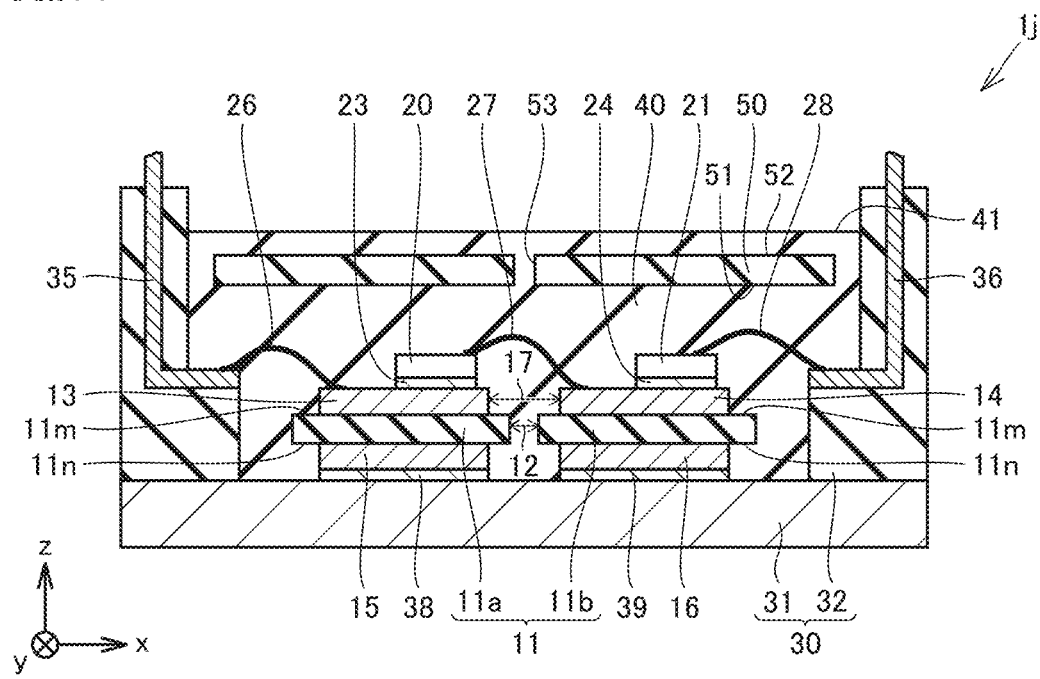
FIG. 11 is a schematic cross-sectional view of a power semiconductor module according to a variation of embodiment 5.

With reference to FIG. 10, a power semiconductor module 1i in embodiment 5 will now be described. Power semiconductor module 1i in the present embodiment has a configuration similar to that of power semiconductor module 1 in embodiment 1, but differs from power semiconductor module 1 mainly in the following respects. In power semiconductor module 1i, first barrier layer 50 is provided in sealing member 40. First stress relaxation portion 53 may be a first through portion connecting first surface 51 to second surface 52, as seen in a power semiconductor module 1j in a variation of the present embodiment shown in FIG. 11.

Power semiconductor module 1i, 1j in the present embodiment has the following advantageous effects in addition to those of power semiconductor module 1, 1d in embodiment 1. First barrier layer 50 is provided in sealing member 40. First barrier layer 50 is not exposed to oxygen in the air. This prevents first barrier layer 50 from oxidation and deterioration when power semiconductor module 1i, 1j is operating and rises to a high temperature. The reliability of power semiconductor module 1i, 1j can thus be improved.

Embodiment 6

Figure 12:
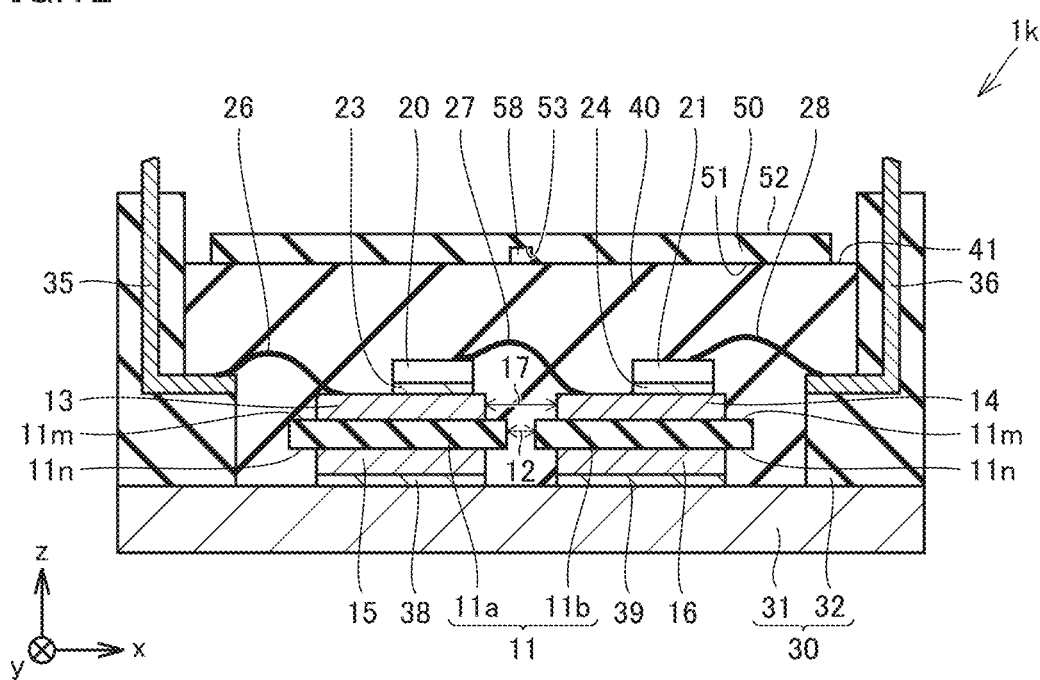
FIG. 12 is a schematic cross-sectional view of a power semiconductor module according to embodiment 6.

With reference to FIG. 12, a power semiconductor module 1k in embodiment 6 will now be described. Power semiconductor module 1k in the present embodiment has a configuration similar to that of power semiconductor module 1b in the first variation of embodiment 1, but differs from power semiconductor module 1b mainly in the following respects. At least a part of the first recess is a cavity 58 which is not filled with sealing member 40. In particular, the whole of first recess is cavity 58.

Power semiconductor module 1k in the present embodiment has the following advantageous effects in addition to those of power semiconductor module 1, 1b in embodiment 1. In power semiconductor module 1k in the present embodiment, first barrier layer 50 is provided on sealing member 40. The first recess is formed in first surface 51. At least a part of the first recess is cavity 58 which is not filled with sealing member 40. A larger power semiconductor module 1k will produce an increased stress on first barrier layer 50 when warping. Cavity 58 reduces the increased stress, and prevents first barrier layer 50 from cracking. The reliability of power semiconductor module 1k can thus be further improved.

Embodiment 7

Figure 13:
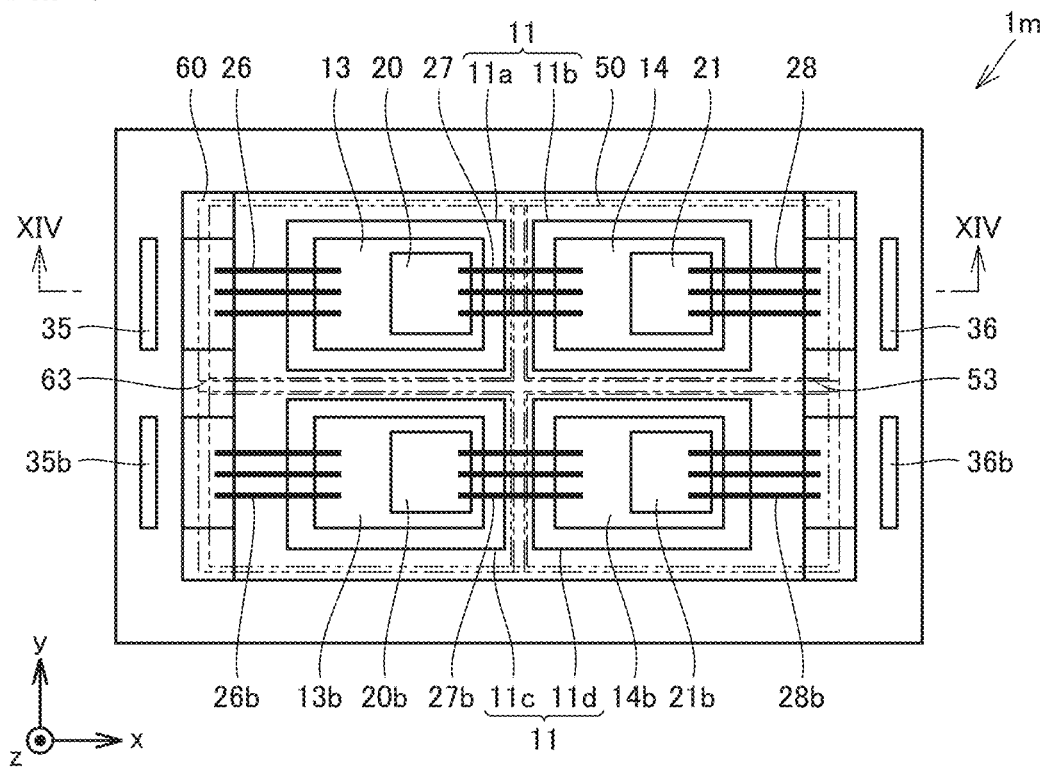
FIG. 13 is a schematic plan view of a power semiconductor module according to embodiment 7.
Figure 14:
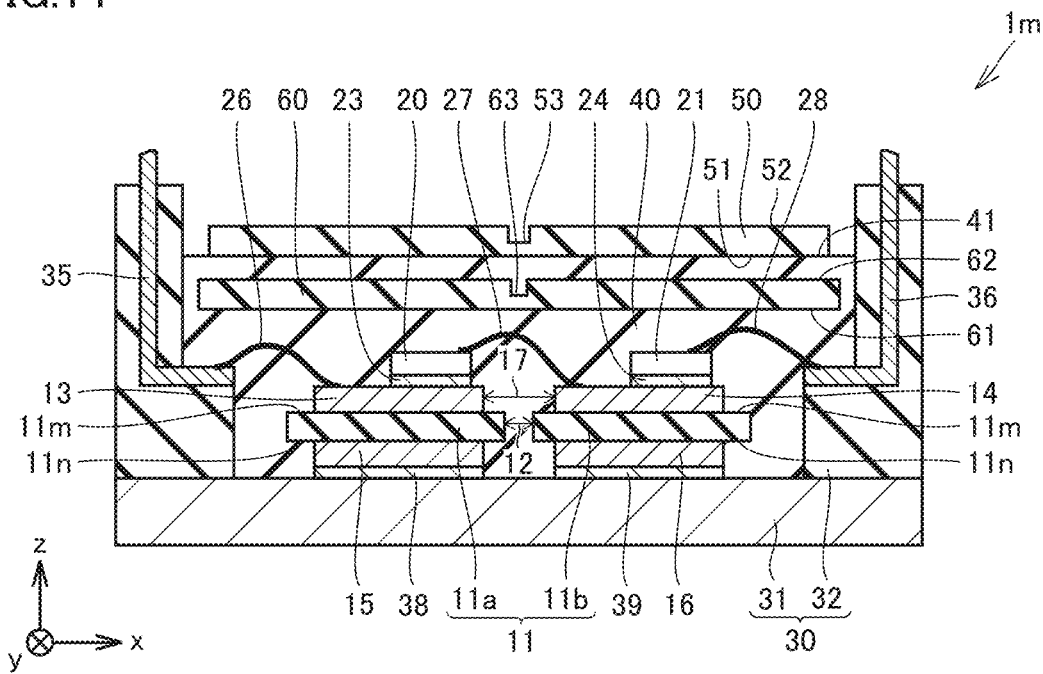
FIG. 14 is a schematic cross-sectional view of the power semiconductor module according to embodiment 7, taken along section line XIV-XIV in FIG. 13.

With reference to FIGS. 13 and 14, a power semiconductor module 1m in embodiment 7 will now be described. Power semiconductor module 1m in the present embodiment has a configuration and advantageous effects similar to those of power semiconductor module 1 in embodiment 1, but differs from power semiconductor module 1 mainly in the following respects.

Power semiconductor module 1m further includes a second barrier layer 60 such that second barrier layer 60 and first barrier layer 50 are stacked. Sealing member 40 may be interposed between first barrier layer 50 and second barrier layer 60. In the present embodiment, second barrier layer 60 is closer to first and second semiconductor devices 20 and 21 than first barrier layer 50 is to first and second semiconductor devices 20 and 21. Second barrier layer 60 is disposed between first barrier layer 50, and first and second semiconductor devices 20 and 21. Second barrier layer 60 is provided in sealing member 40. Second barrier layer 60 may be remoter from first and second semiconductor devices 20 and 21 than first barrier layer 50 is from first and second semiconductor devices 20 and 21.

In plan view of first main face 11m of insulating substrate 11, second barrier layer 60 covers first semiconductor device 20, second semiconductor device 21, third semiconductor device 20b, and fourth semiconductor device 21b. In plan view of first main face 11m of insulating substrate 11, second barrier layer 60 may cover 80% or more of the area of outer surface 41 of sealing member 40; or may cover 90% or more of the area of outer surface 41 of sealing member 40; or may cover the whole outer surface 41 of sealing member 40.

In the present embodiment, in plan view of first main face 11m of insulating substrate 11, second barrier layer 60 has a larger area than first barrier layer 50. In plan view of first main face 11m of insulating substrate 11, the second outer periphery of second barrier layer 60 is located on the outer side relative to the first outer periphery of first barrier layer 50. In plan view of first main face 11m of insulating substrate 11, second barrier layer 60 may have the same area as first barrier layer 50, or may have a smaller area than first barrier layer 50. In plan view of first main face 11m of insulating substrate 11, the second outer periphery of second barrier layer 60 may align with the first outer periphery of first barrier layer 50, or may be on the inner side relative to the first outer periphery of first barrier layer 50.

Second barrier layer 60 prevents moisture and gas (e.g., sulfur gas) from entering power semiconductor module 1m. Second barrier layer 60 prevents or reduces moisture and gas from penetrating to first semiconductor device 20, second semiconductor device 21, first conductive circuit pattern 13, second conductive circuit pattern 14, insulating substrate 11, first conductive member 15, and second conductive member 16. Second barrier layer 60 can prevent the increase in leakage current from, for example, first and second semiconductor devices 20 and 21; and can prevent the decrease in insulation performance of, for example, insulating substrate 11 (first insulating substrate segment 11a, second insulating substrate segment 11b).

Second barrier layer 60 prevents or reduces moisture and gas from penetrating to third semiconductor device 20b, fourth semiconductor device 21b, third conductive circuit pattern 13b, fourth conductive circuit pattern 14b, the third conductive member (not shown), and the fourth conductive member (not shown). Second barrier layer 60 can prevent the increase in leakage current from third and fourth semiconductor devices 20b and 21b; and can prevent the decrease in insulation performance of, for example, insulating substrate 11 (third insulating substrate segment 11c, fourth insulating substrate segment 11d).

Second barrier layer 60 is composed of a material having low permeability to moisture and gas. Second barrier layer 60 may be composed of a thermoplastic resin, such as polyphenylenesulfide (PPS), polybutylene terephthalate (PBT), or polyether ether ketone (PEEK); a thermosetting resin; a fluoropolymer, such as polytetrafluoroethylene (PTFE); a ceramic or glass material; or a mixture of any of these materials.

At least one of second barrier layer 60 and sealing member 40 includes a second stress relaxation portion 63. In the present embodiment, second barrier layer 60 includes second stress relaxation portion 63. Second barrier layer 60 includes a third surface 61 on the side where first and second semiconductor devices 20 and 21 are located, and a fourth surface 62 on the side opposite to third surface 61. Second stress relaxation portion 63 is a third recess formed in at least one of third surface 61 and fourth surface 62. The third recess may extend along at least one of the first direction (x-direction) and second direction (y-direction). The third recess may include a plurality of third sub-recesses aligned along at least one of the first direction (x-direction) and second direction (y-direction). In plan view of first main face 11m of insulating substrate 11, at least a part of second stress relaxation portion 63 may overlap first stress relaxation portion 53.

Figure 15:
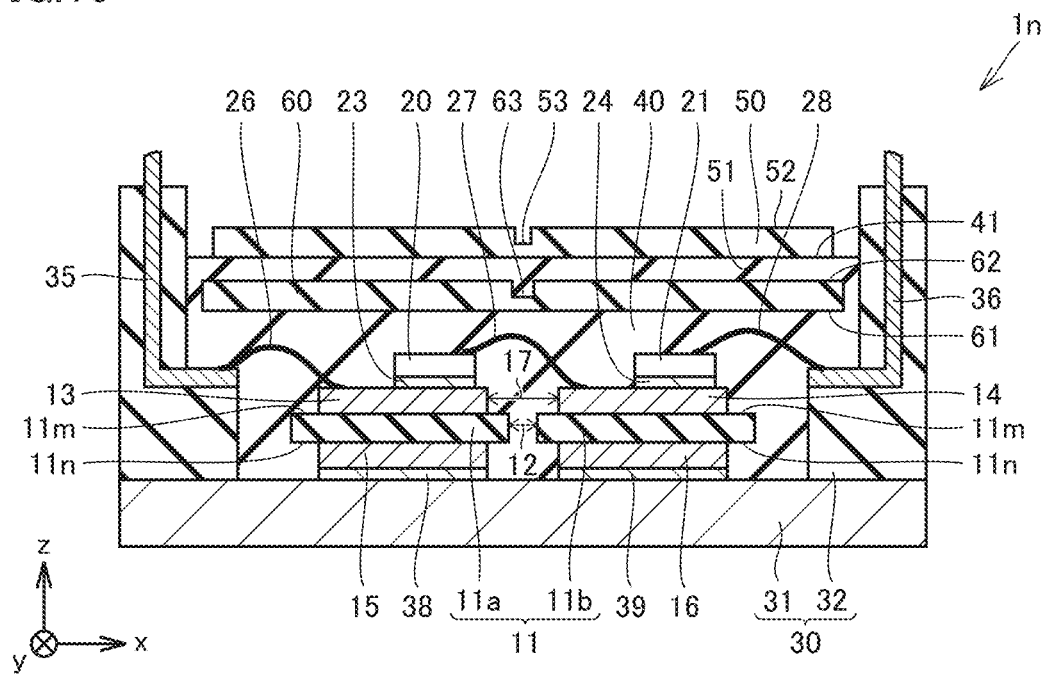
FIG. 15 is a schematic cross-sectional view of a power semiconductor module according to a first variation of embodiment 7.

In the present embodiment shown in FIG. 14, second stress relaxation portion 63 may be a third recess formed in fourth surface 62 of second barrier layer 60. The third recess in second barrier layer 60 may have a smaller width than the first recess in first barrier layer 50. The third recess in second barrier layer 60 may have a larger width than the first recess in first barrier layer 50, as seen in a power semiconductor module 1n in a first variation of the present embodiment shown in FIG. 15. The third recess in second barrier layer 60 may have the same width as the first recess in first barrier layer 50.

While in operation or under an ambient temperature change, power semiconductor module 1m, 1n undergoes a temperature change and warps. Second stress relaxation portion 63 reduces stress on second barrier layer 60 caused by the warp of power semiconductor module 1m, 1n. Specifically, second stress relaxation portion 63 in the form of a third recess reduces the thickness of at least one of second barrier layer 60 and sealing member 40. The third recess allows at least one of second barrier layer 60 and sealing member 40 to easily deform in accordance with the warping deformation of power semiconductor module 1m, 1n. The third recess reduces stress on second barrier layer 60 caused by the warp of power semiconductor module 1m, 1n, and prevents second barrier layer 60 from cracking.

In plan view of first main face 11m of insulating substrate 11, second stress relaxation portion 63 overlaps first gap 17 between first conductive circuit pattern 13 and second conductive circuit pattern 14. In plan view of first main face 11m of insulating substrate 11, second stress relaxation portion 63 may have a smaller width than first gap 17, and may be within first gap 17. In plan view of first main face 11m of insulating substrate 11, second stress relaxation portion 63 may have the same width as first gap 17, or may have a larger width than first gap 17.

In plan view of first main face 11m of insulating substrate 11, second stress relaxation portion 63 overlaps the gap between third conductive circuit pattern 13b and fourth conductive circuit pattern 14b. In plan view of first main face 11m of insulating substrate 11, second stress relaxation portion 63 may have a smaller width than the gap between third conductive circuit pattern 13b and fourth conductive circuit pattern 14b, and may be within the gap between third conductive circuit pattern 13b and fourth conductive circuit pattern 14b. In plan view of first main face 11m of insulating substrate 11, second stress relaxation portion 63 may have the same width as the gap between third conductive circuit pattern 13b and fourth conductive circuit pattern 14b, or may have a larger width than the gap between third conductive circuit pattern 13b and fourth conductive circuit pattern 14b.

In plan view of first main face 11m of insulating substrate 11, second stress relaxation portion 63 overlaps the gap between first conductive circuit pattern 13 and third conductive circuit pattern 13b. In plan view of first main face 11m of insulating substrate 11, second stress relaxation portion 63 may have a smaller width than the gap between first conductive circuit pattern 13 and third conductive circuit pattern 13b, and may be within the gap between first conductive circuit pattern 13 and third conductive circuit pattern 13b. In plan view of first main face 11m of insulating substrate 11, second stress relaxation portion 63 may have the same width as the gap between first conductive circuit pattern 13 and third conductive circuit pattern 13b, or may have a larger width than the gap between first conductive circuit pattern 13 and third conductive circuit pattern 13b.

In plan view of first main face 11m of insulating substrate 11, second stress relaxation portion 63 overlaps the gap between second conductive circuit pattern 14 and fourth conductive circuit pattern 14b. In plan view of first main face 11m of insulating substrate 11, second stress relaxation portion 63 may have a smaller width than the gap between second conductive circuit pattern 14 and fourth conductive circuit pattern 14b, and may be within the gap between second conductive circuit pattern 14 and fourth conductive circuit pattern 14b. In plan view of first main face 11m of insulating substrate 11, second stress relaxation portion 63 may have the same width as the gap between second conductive circuit pattern 14 and fourth conductive circuit pattern 14b, or may have a larger width than the gap between second conductive circuit pattern 14 and fourth conductive circuit pattern 14b.

In plan view of first main face 11m of insulating substrate 11, second stress relaxation portion 63 may overlap second gap 12 between first insulating substrate segment 11a and second insulating substrate segment 11b. In plan view of first main face 11m of insulating substrate 11, second stress relaxation portion 63 may have a smaller width than second gap 12, and may be within second gap 12. In plan view of first main face 11m of insulating substrate 11, second stress relaxation portion 63 may have the same width as second gap 12, or may have a larger width than second gap 12.

In plan view of first main face 11m of insulating substrate 11, second stress relaxation portion 63 may overlap the gap between third insulating substrate segment 11c and fourth insulating substrate segment 11d. In plan view of first main face 11m of insulating substrate 11, second stress relaxation portion 63 may have a smaller width than the gap between third insulating substrate segment 11c and fourth insulating substrate segment 11d, and may be within the gap between third insulating substrate segment 11c and fourth insulating substrate segment 11d. In plan view of first main face 11m of insulating substrate 11, second stress relaxation portion 63 may have the same width as the gap between third insulating substrate segment 11c and fourth insulating substrate segment 11d, or may have a larger width than the gap between third insulating substrate segment 11c and fourth insulating substrate segment 11d.

In plan view of first main face 11m of insulating substrate 11, second stress relaxation portion 63 may overlap the gap between first insulating substrate segment 11a and third insulating substrate segment 11c. In plan view of first main face 11m of insulating substrate 11, second stress relaxation portion 63 may have a smaller width than the gap between first insulating substrate segment 11a and third insulating substrate segment 11c, and may be within the gap between first insulating substrate segment 11a and third insulating substrate segment 11c. In plan view of first main face 11m of insulating substrate 11, second stress relaxation portion 63 may have the same width as the gap between first insulating substrate segment 11a and third insulating substrate segment 11c, or may have a larger width than the gap between first insulating substrate segment 11a and third insulating substrate segment 11c.

In plan view of first main face 11m of insulating substrate 11, second stress relaxation portion 63 may overlap the gap between second insulating substrate segment 11b and fourth insulating substrate segment 11d. In plan view of first main face 11m of insulating substrate 11, second stress relaxation portion 63 may have a smaller width than the gap between second insulating substrate segment 11b and fourth insulating substrate segment 11d, and may be within the gap between second insulating substrate segment 11b and fourth insulating substrate segment 11d. In plan view of first main face 11m of insulating substrate 11, second stress relaxation portion 63 may have the same width as the gap between second insulating substrate segment 11b and fourth insulating substrate segment 11d, or may have a larger width than the gap between second insulating substrate segment 11b and fourth insulating substrate segment 11d.

When power semiconductor module 1m, 1n undergoes a temperature change and warps, stress concentrates on a portion of second barrier layer 60 corresponding to the central portion of power semiconductor module 1m, 1n in the first direction (x-direction) and corresponding to the central portion of power semiconductor module 1m, 1n in the second direction (y-direction). When power semiconductor module 1m, 1n undergoes a temperature change and warps, stress concentrates on a portion of second barrier layer 60 corresponding to second gap 12 between first insulating substrate segment 11a and second insulating substrate segment 11b, corresponding to the gap between third insulating substrate segment 11c and fourth insulating substrate segment 11d, corresponding to the gap between first insulating substrate segment 11a and third insulating substrate segment 11c, and corresponding to the gap between second insulating substrate segment 11b and fourth insulating substrate segment 11d. In the present embodiment, second stress relaxation portion 63 is provided in a portion of second barrier layer 60 susceptible to stress concentration. Second stress relaxation portion 63 effectively prevents second barrier layer 60 from cracking.

Figure 16:
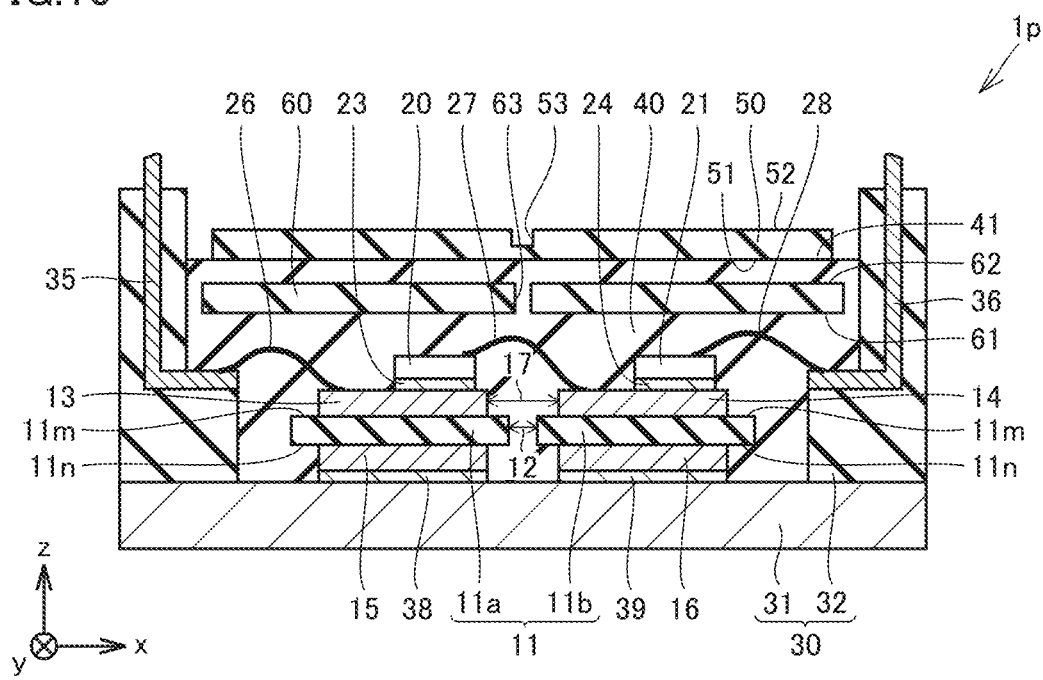
FIG. 16 is a schematic cross-sectional view of a power semiconductor module according to a second variation of embodiment 7.

Second stress relaxation portion 63 may be a second through portion connecting third surface 61 to fourth surface 62, as seen in a power semiconductor module 1p in a second variation of the present embodiment shown in FIG. 16. The second through portion may be a second slot extending along at least one of the first direction (x-direction) and second direction (y-direction). The second through portion may include a plurality of second through holes aligned along at least one of the first direction (x-direction) and second direction (y-direction). The second through portion may separate second barrier layer 60 into a plurality of second barrier layer segments. In plan view of first main face 11m of insulating substrate 11, at least a part of second stress relaxation portion 63 (second through portion) overlaps first barrier layer 50. In particular, in plan view of first main face 11m of insulating substrate 11, the whole of second stress relaxation portion 63 (second through portion) overlaps first barrier layer 50.

A larger power semiconductor module 1p will produce an increased stress on second barrier layer 60 when warping. Second stress relaxation portion 63 (second through portion) reduces the increased stress, and prevents second barrier layer 60 from cracking. Second stress relaxation portion 63 thus prevents second barrier layer 60 from cracking.

Power semiconductor module 1m, 1n, 1p in the present embodiment has the following advantageous effects in addition to those of power semiconductor module 1 in embodiment 1. Power semiconductor module 1m, 1n, 1p further includes second barrier layer 60 such that second barrier layer 60 and first barrier layer 50 are stacked. Second barrier layer 60 prevents or reduces moisture and gas from penetrating to first semiconductor device 20, second semiconductor device 21, first conductive circuit pattern 13, second conductive circuit pattern 14, and insulating substrate 11. The reliability of power semiconductor module 1m, 1n, 1p can thus be further improved.

In power semiconductor module 1m, 1n, 1p, at least one of second barrier layer 60 and sealing member 40 includes second stress relaxation portion 63. Second stress relaxation portion 63 allows at least one of second barrier layer 60 and sealing member 40 to easily deform in accordance with the warping deformation of power semiconductor module 1m, 1n, 1p. Second stress relaxation portion 63 reduces stress on second barrier layer 60 caused by the warp of power semiconductor module 1m, 1n, 1p, and prevents second barrier layer 60 from cracking. The reliability of power semiconductor module 1m, 1n, 1p can thus be improved.

Embodiment 8

Figure 17:
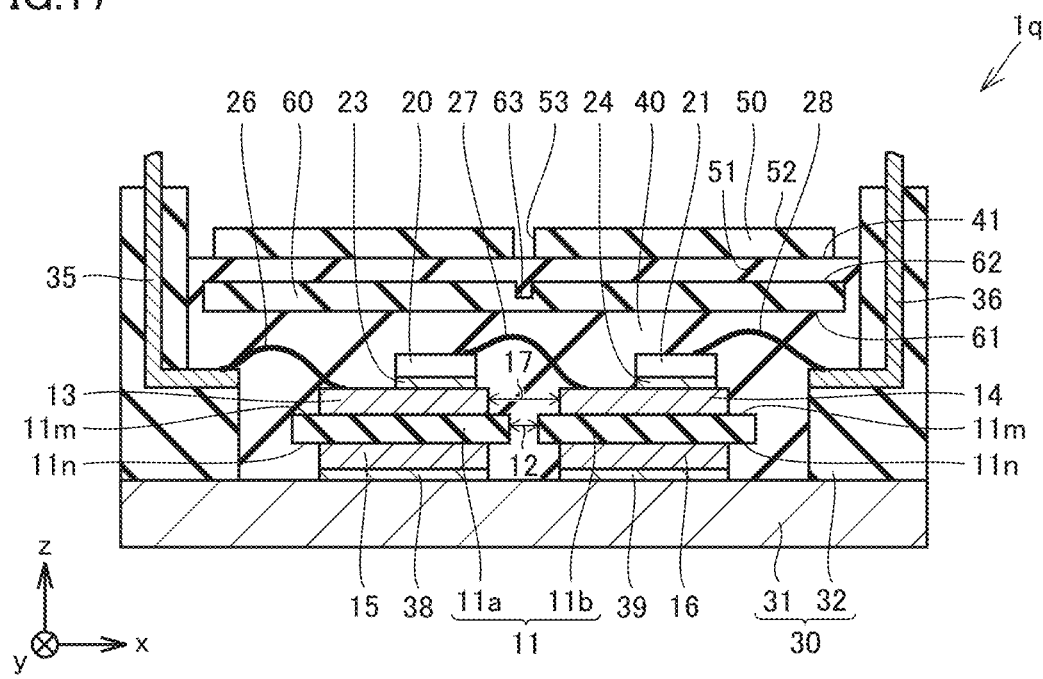
FIG. 17 is a schematic cross-sectional view of a power semiconductor module according to embodiment 8.

With reference to FIG. 17, a power semiconductor module 1q in embodiment 8 will now be described. Power semiconductor module 1q in the present embodiment has a configuration and advantageous effects similar to those of power semiconductor module 1m in embodiment 7, but differs from power semiconductor module 1m mainly in the following respects.

In power semiconductor module 1q, first stress relaxation portion 53 is a first through portion connecting first surface 51 to second surface 52. The first through portion may be a first slot extending along at least one of the first direction (x-direction) and second direction (y-direction). The first through portion may include a plurality of first through holes aligned along at least one of the first direction (x-direction) and second direction (y-direction). The first through portion may separate first barrier layer 50 into a plurality of first barrier layer segments. In plan view of first main face 11m of insulating substrate 11, at least a part of first stress relaxation portion 53 (first through portion) overlaps second barrier layer 60. In particular, in plan view of first main face 11m of insulating substrate 11, the whole of first stress relaxation portion 53 (first through portion) overlaps second barrier layer 60.

Power semiconductor module 1q in the present embodiment has the following advantageous effects in addition to those of power semiconductor module 1m in embodiment 7. A larger power semiconductor module 1q will produce an increased stress on first barrier layer 50 when warping. First stress relaxation portion 53 (first through portion) reduces the increased stress, and prevents first barrier layer 50 from cracking. Further, second barrier layer 60 prevents or reduces moisture and gas, which has entered through first stress relaxation portion 53 (first through portion), from penetrating to first semiconductor device 20, second semiconductor device 21, first conductive circuit pattern 13, second conductive circuit pattern 14, and insulating substrate 11. The reliability of power semiconductor module 1q can thus be improved.

Embodiment 9

Figure 18:
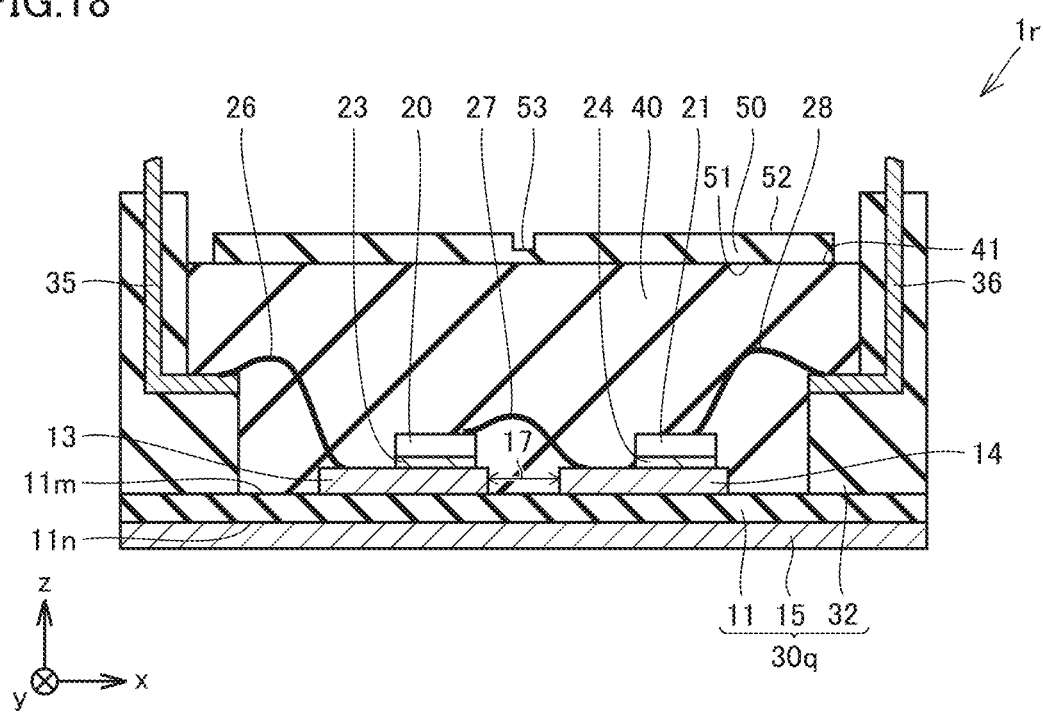
FIG. 18 is a schematic cross-sectional view of a power semiconductor module according to embodiment 9.

With reference to FIG. 18, a power semiconductor module 1r in embodiment 9 will now be described. Power semiconductor module 1r in the present embodiment has a configuration and advantageous effects similar to those of power semiconductor module 1 in embodiment 1, but differs from power semiconductor module 1 mainly in the following respects.

Instead of base plate 31 (FIG. 2), insulating substrate 11 and first conductive member 15 may form a part of a case 30q. In the present embodiment, insulating substrate 11 is a single plate that is not divided into first insulating substrate segment 11a, second insulating substrate segment 11b, third insulating substrate segment 11c, and fourth insulating substrate segment 11d. First conductive member 15 lies under first conductive circuit pattern 13, second conductive circuit pattern 14, and enclosure 32, with insulating substrate 11 being interposed between first conductive member 15 and these components 13, 14, and 32. First conductive member 15 may also lie under third conductive circuit pattern 13b and fourth conductive circuit pattern 14b, with insulating substrate 11 being interposed between first conductive member 15 and these components 13b and 14b. Second conductive member 16, the third conductive member (not shown), and the fourth conductive member (not shown) are not formed on second main face 11n of insulating substrate 11.

Embodiment 10

Embodiment 10 is an application of power semiconductor module 1, 1b, 1c, 1d, 1e, 1f, 1g, 1h, 1i, 1j, 1l, 1m, 1n, 1p, 1q, 1r according to any one of embodiments 1 to 9 to a power conversion apparatus. Here, a power conversion apparatus 200 in the present embodiment may be, but is not limited to, a three-phase inverter.

Figure 19:
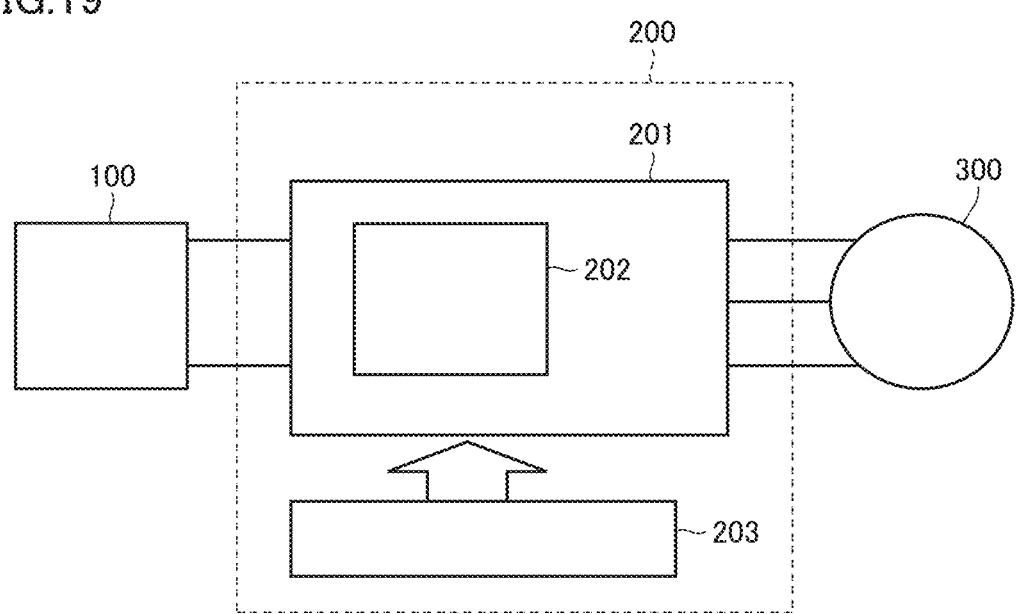
FIG. 19 is a block diagram showing a configuration of a power conversion system according to embodiment 10.

The power conversion system shown in FIG. 19 includes a power supply 100, power conversion apparatus 200, and a load 300. Power supply 100 is a DC power supply that supplies DC power to power conversion apparatus 200. Power supply 100 may be, but is not limited to, a DC system, a solar cell, or a storage battery; or may be a rectifier circuit or AC-to-DC converter connected to an AC system. Power supply 100 may be a DC-to-DC converter that converts DC power from a DC system into other DC power.

Power conversion apparatus 200, which is a three-phase inverter connected between power supply 100 and load 300, converts DC power from power supply 100 into AC power and supplies the AC power to load 300. As shown in FIG. 19, power conversion apparatus 200 includes a main conversion circuit 201 that converts DC power into AC power and outputs the AC power which is converted power, and a control circuit 203 that outputs a control signal to main conversion circuit 201 for controlling main conversion circuit 201.

Load 300 is a three-phase electric motor that is driven by AC power from power conversion apparatus 200. Load 300 may be, but is not limited to, an electric motor for a variety of electrical equipment, such as a hybrid vehicle, an electric vehicle, a railway vehicle, an elevator, or an air conditioner.

Power conversion apparatus 200 will now be described in detail. Main conversion circuit 201 includes switching devices (not shown) and freewheeling diodes (not shown). Main conversion circuit 201 switches the voltage from power supply 100 using the switching devices, thereby converting DC power from power supply 100 into AC power to supply the AC power to load 300. Main conversion circuit 201 may have a variety of specific circuit configurations. Main conversion circuit 201 according to the present embodiment may be a two-level three-phase full-bridge circuit including six switching devices and six freewheeling diodes each connected in antiparallel to a corresponding one of the switching devices. Power semiconductor module 1, 1b, 1c, 1d, 1e, 1f, 1g, 1h, 1j, 1k, 1m, 1n, 1p, 1q, 1r in any one of embodiments 1 to 9 described above can be applied to at least any one of a set of switching devices and a set of freewheeling diodes in main conversion circuit 201. Power semiconductor module 1, 1b, 1c, 1d, 1e, 1f, 1g, 1h, 1i, 1j, 1k, 1m, 1n, 1p, 1q, 1r in any one of embodiments 1 to 9 described above can be applied to power semiconductor module 202 included in main conversion circuit 201. The six switching devices form sets of upper and lower arms, each of which includes two switching devices connected in series. Each set of upper and lower arms is for a corresponding one of the phases (U, V, and W phases) of the full-bridge circuit. The output terminals of the respective sets of upper and lower arms, i.e., three output terminals of main conversion circuit 201, are connected to load 300.

Main conversion circuit 201 includes drive circuits (not shown) to drive the respective switching devices. The drive circuits may be incorporated in, or provided outside of, power semiconductor module 202. Each drive circuit generates a drive signal for driving a corresponding switching device included in main conversion circuit 201, and supplies the drive signal to the control electrode of the switching device in main conversion circuit 201. Specifically, each drive circuit outputs a drive signal to the control electrode of a corresponding switching device, in accordance with a control signal from control circuit 203. The drive signal is for turning on or off the switching device.

In power conversion apparatus 200 according to the present embodiment, power semiconductor module 1, 1b, 1c, 1d, 1e, 1f, 1g, 1h, 1j, 1k, 1m, 1n, 1p, 1q, 1r according to any one of embodiments 1 to 9 is applied to power semiconductor module 202 included in main conversion circuit 201. Thus, power conversion apparatus 200 according to the present embodiment has improved reliability.

Although the present embodiment describes an application of the present invention to a two-level three-phase inverter, this is not a limitation. The present invention may be applied to a variety of power conversion apparatuses. The two-level power conversion apparatus in the present embodiment may instead be a three-level or multilevel power conversion apparatus. If the power conversion apparatus supplies power to a single-phase load, the present invention may be applied to a single-phase inverter. If the power conversion apparatus supplies power to a DC load or the like, the present invention may be applied to a DC-to-DC converter or an AC-to-DC converter.

The power conversion apparatus to which the present invention is applied is not limited to a case where an electric motor is used as a load. The power conversion apparatus may be incorporated in a power supply for, for example, an electric discharge machine or laser beam machine, or a power supply for an induction heating cooker or wireless powering system. The power conversion apparatus to which the present invention is applied may be used as a power conditioner for a photovoltaic system, an electricity storage system or the like.

It should be understood that embodiments 1 to 10 disclosed herein are by way of example in every respect, not by way of limitation. Two or more of embodiments 1 to 10 disclosed herein may be combined where compatible. The scope of the present invention is defined not by the above description but by the terms of the claims, and is intended to include any modification within the meaning and scope equivalent to the terms of the claims.

REFERENCE SIGNS LIST

1, 1b, 1c, 1d, 1e, 1f, 1g, 1h, 1i, 1j, 1k, 1m, 1n, 1p, 1q, 1r: power semiconductor module; 11: insulating substrate; 11a: first insulating substrate segment; 11b: second insulating substrate segment; 11c: third insulating substrate segment; 11d: fourth insulating substrate segment; 11m: first main face; 11n: second main face; 12: second gap; 13: first conductive circuit pattern; 13b: third conductive circuit pattern; 14: second conductive circuit pattern; 14b: fourth conductive circuit pattern; 15: first conductive member; 16: second conductive member; 17: first gap; 20: first semiconductor device; 20b: third semiconductor device; 21: second semiconductor device; 21b: fourth semiconductor device; 23, 24: conductive joining member; 26, 26b, 27, 27b, 28, 28b: conductive wire; 30, 30q: case; 31: base plate; 32: enclosure; 35, 35b, 36, 36b: lead terminal; 38, 39: joining layer; 40: sealing member; 41: outer surface; 43, 53: first stress relaxation portion; 45: second portion; 50: first barrier layer; 51: first surface; 52: second surface; 55: first portion; 56: protrusion; 58: cavity; 60: second barrier layer; 61: third surface; 62: fourth surface; 63: second stress relaxation portion; 100: power supply; 200: power conversion apparatus; 201: main conversion circuit; 202: power semiconductor module; 203: control circuit; 300: load

The invention claimed is:

1. A power semiconductor module comprising:
   an insulating substrate including a first main face;
   a first conductive circuit pattern provided on the first main face;
   a second conductive circuit pattern provided on the first main face, the second conductive circuit pattern being separated from the first conductive circuit pattern by a first gap;
   a first semiconductor device joined to the first conductive circuit pattern;
   a second semiconductor device joined to the second conductive circuit pattern;
   a sealing member sealing the first semiconductor device, the second semiconductor device, the first conductive circuit pattern, and the second conductive circuit pattern; and
   a first barrier layer disposed on an opposite side from the insulating substrate with respect to the first semiconductor device and the second semiconductor device, the first barrier layer being provided on or in the sealing member,
   at least one of the first barrier layer and the sealing member including a first stress relaxation portion, in plan view of the first main face, the first stress relaxation portion overlapping the first gap in such a way that a center of the first gap is within the first stress relaxation portion.

2. The power semiconductor module according to claim 1, wherein
the first barrier layer includes
a first surface on a side where the first semiconductor device and the second semiconductor device are located, and
a second surface on a side opposite to the first surface, and
the first stress relaxation portion is a first recess formed in at least one of the first surface and the second surface.

3. The power semiconductor module according to claim 2, wherein
the first barrier layer is provided on the sealing member,
the first recess is formed in the first surface, and
at least a part of the first recess is a cavity which is not filled with the sealing member.

4. The power semiconductor module according to claim 2, wherein
the first stress relaxation portion is provided in the first barrier layer in such a way that the first stress relaxation portion is at a location corresponding to the first conductive circuit pattern, the second conductive circuit pattern, and the first gap,
a thickness of the first barrier layer gradually decreases toward a first portion of the first barrier layer at least in the first stress relaxation portion, wherein the first portion overlaps the first gap in plan view of the first main face, and
the thickness of the first barrier layer is smallest at the first portion of the first stress relaxation portion.

5. The power semiconductor module according to claim 1, wherein
the first barrier layer includes
a first surface on a side where the first semiconductor device and the second semiconductor device are located, and
a second surface on a side opposite to the first surface, and
the first stress relaxation portion is a first through portion connecting the first surface to the second surface.

6. The power semiconductor module according to claim 5, further comprising a second barrier layer such that the second barrier layer and the first barrier layer are stacked, and
in plan view of the first main face, at least a part of the first through portion overlaps the second barrier layer.

7. The power semiconductor module according to claim 6, wherein
at least one of the second barrier layer and the sealing member includes a second stress relaxation portion.

8. The power semiconductor module according to claim 1, wherein
the sealing member includes an outer surface, and
the first stress relaxation portion is a second recess formed in the outer surface.

9. The power semiconductor module according to claim 8, wherein
the first stress relaxation portion is provided in the sealing member in such a way that the first stress relaxation portion is at a location corresponding to the first conductive circuit pattern, the second conductive circuit pattern, and the first gap, and
the outer surface is gradually recessed toward a second portion of the outer surface at least in the first stress relaxation portion, wherein the second portion overlaps the first gap in plan view of the first main face, and
the outer surface is recessed deepest at the second portion of the first stress relaxation portion.

10. The power semiconductor module according to claim 1, wherein
the insulating substrate includes a first insulating substrate segment and a second insulating substrate segment, wherein
the first conductive circuit pattern is provided on the first insulating substrate segment,
the second conductive circuit pattern is provided on the second insulating substrate segment, and
the second insulating substrate segment is separated from the first insulating substrate segment by a second gap, and
in plan view of the first main face, the first stress relaxation portion overlaps the second gap.

11. The power semiconductor module according to claim 10, further comprising a base plate disposed on an opposite side from the first semiconductor device and the second semiconductor device with respect to the insulating substrate, wherein
the first insulating substrate segment and the second insulating substrate segment are joined to the base plate.

12. The power semiconductor module according to claim 1, further comprising a second barrier layer such that the second barrier layer and the first barrier layer are stacked.

13. The power semiconductor module according to claim 12, wherein
at least one of the second barrier layer and the sealing member includes a second stress relaxation portion.

14. The power semiconductor module according to claim 13, wherein
the second barrier layer includes
a third surface on a side where the first semiconductor device and the second semiconductor device are located, and
a fourth surface on a side opposite to the third surface, and
the second stress relaxation portion is a third recess formed in at least one of the third surface and the fourth surface.

15. The power semiconductor module according to claim 13, wherein
the second barrier layer includes
a third surface on a side where the first semiconductor device and the second semiconductor device are located, and
a fourth surface on a side opposite to the third surface, and
the second stress relaxation portion is a second through portion connecting the third surface to the fourth surface.

16. The power semiconductor module according to claim 13, wherein
in plan view of the first main face, at least a part of the second stress relaxation portion overlaps the first stress relaxation portion.

17. A power conversion apparatus comprising:
a main conversion circuit including the power semiconductor module according to claim 1, wherein the main conversion circuit converts input power and outputs the converted power, and
a control circuit to output a control signal to the main conversion circuit for controlling the main conversion circuit.

* * * * *